(12) United States Patent
Yoon et al.

(10) Patent No.: US 12,237,439 B2
(45) Date of Patent: Feb. 25, 2025

(54) DISPLAY DEVICE

(71) Applicant: SAMSUNG ELECTRONICS CO., LTD., Suwon-si (KR)

(72) Inventors: Euijoon Yoon, Seoul (KR); Jongmyeong Kim, Uiwang-si (KR); Jehong Oh, Seoul (KR); Seungmin Lee, Seoul (KR); Jungel Ryu, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 730 days.

(21) Appl. No.: 17/238,163

(22) Filed: Apr. 22, 2021

(65) Prior Publication Data

US 2021/0336084 A1  Oct. 28, 2021

(30) Foreign Application Priority Data

Apr. 23, 2020 (KR) .................. 10-2020-0049141
Apr. 23, 2020 (KR) .................. 10-2020-0049151
Jan. 29, 2021 (KR) .................. 10-2021-0013033

(51) Int. Cl.
*H01L 33/18* (2010.01)
*H01L 25/075* (2006.01)
(Continued)

(52) U.S. Cl.
CPC .......... *H01L 33/18* (2013.01); *H01L 25/0753* (2013.01); *H01L 33/24* (2013.01); *H01L 33/32* (2013.01); *H01L 33/62* (2013.01)

(58) Field of Classification Search
CPC ......... H01L 33/32; H01L 33/62; H01L 33/44; H01L 2933/0033; H01L 33/18; H01L 25/0753; H01L 33/24; H01L 33/30
See application file for complete search history.

(56) References Cited

U.S. PATENT DOCUMENTS 6,936,863 B2  8/2005  Udagawa et al.
7,888,690 B2  2/2011  Iwafuchi et al.
(Continued)

FOREIGN PATENT DOCUMENTS

EP    3 599 639 A1    1/2020
JP    2019-208078 A   12/2019
(Continued)

OTHER PUBLICATIONS

International Search Report (PCT/ISA/210) issued by the International Searching Authority on Oct. 25, 2021 in corresponding International Application No. PCT/KR2021/005822.
(Continued)

*Primary Examiner* — Ratisha Mehta
(74) *Attorney, Agent, or Firm* — Sughrue Mion, PLLC

(57) ABSTRACT

A display device with improved light-emitting efficiency is disclosed. The display device includes a plurality of pixels, a light emitting device provided in each of the pixels, the light emitting device having first and second surfaces which are opposite to each other, first and second electrodes electrically and respectively connected to the first and second surfaces of the light emitting device, and a metal oxide pattern interposed between the second surface of the light emitting device and the second electrode. The metal oxide pattern includes first and second regions. The first region encloses the second region, and the second region has a contact hole exposing at least a portion of the second surface. The second electrode is coupled to the second surface through the contact hole, and the first and second regions have crystalline phases different from each other.

26 Claims, 27 Drawing Sheets

(51) Int. Cl.
*H01L 33/24* (2010.01)
*H01L 33/32* (2010.01)
*H01L 33/62* (2010.01)

(56) References Cited

U.S. PATENT DOCUMENTS

| | | | |
|---|---|---|---|
| 11,081,502 | B2 | 8/2021 | Yamazaki |
| 11,251,337 | B2 | 2/2022 | Yoon et al. |
| 2004/0266043 | A1 | 12/2004 | Oohata et al. |
| 2007/0085087 | A1 | 4/2007 | Okuyama et al. |
| 2016/0372514 | A1* | 12/2016 | Chang ................. H01L 27/1259 |
| 2018/0040788 | A1 | 2/2018 | Jeon et al. |
| 2019/0088820 | A1 | 3/2019 | Danesh et al. |
| 2020/0035890 | A1 | 1/2020 | Yoon et al. |
| 2020/0152832 | A1 | 5/2020 | Yoon et al. |
| 2021/0020872 | A1 | 1/2021 | Park et al. |
| 2021/0320226 | A1* | 10/2021 | Sugawara ............... H01L 33/20 |

FOREIGN PATENT DOCUMENTS

| | | |
|---|---|---|
| KR | 10-2015-0125207 A | 11/2015 |
| KR | 10-2020-0012541 A | 2/2020 |
| KR | 10-2020-0056213 A | 5/2020 |
| TW | 200417060 A | 9/2004 |
| TW | 201820662 A | 6/2018 |
| TW | 202018933 A | 5/2020 |
| TW | 202036886 A | 10/2020 |

OTHER PUBLICATIONS

Communication issued on Nov. 4, 2024 by the Taiwan Intellectual Property Office in Taiwanese Patent Application No. 110117323.
Communication issued on Dec. 19, 2024 by the European Patent Office in European Patent Application No. 21923357.4.

* cited by examiner

DISPLAY DEVICE

CROSS-REFERENCE TO RELATED APPLICATIONS

This U.S. non-provisional patent application claims priority under 35 U.S.C. § 119 to Korean Patent Application Nos. 10-2020-0049141, 10-2020-0049151, and 10-2021-0013033, filed on Apr. 23, 2020, Apr. 23, 2020, and Jan. 29, 2021, respectively, in the Korean Intellectual Property Office, the entire contents of which are hereby incorporated by reference.

BACKGROUND

The present disclosure relates to a display device with improved light-emitting efficiency and a method of manufacturing the same.

A display device includes a light emitting device. The light emitting device is electrically connected to an electrode and emits light in response to a voltage applied to the electrode. The light emitting device may be directly formed on the electrode. Alternatively, the light emitting device may be formed and then may be placed on the electrode.

The light emitting device may be a light-emitting diode (LED). The LED is a semiconductor device converting an energy, which is generated from recombination of holes and electrons when forward voltage is applied to a pn junction diode, to light energy. The LED may be classified into an inorganic LED or an organic LED. The LED may be used not only in small-sized electronic products such as cellphones, but also in large-sized electronic products such as television sets.

SUMMARY

An embodiment of the inventive concept provides a display device with improved light-emitting efficiency and a method of manufacturing the same.

According to an embodiment of the inventive concept, a display device may include a plurality of pixels, a light emitting device provided in each of the plurality of pixels, the light emitting device having a first surface and a second surface, which are opposite to each other, a first electrode electrically connected to the first surface of the light emitting device, a second electrode electrically connected to the second surface of the light emitting device, and a metal oxide pattern interposed between the second surface of the light emitting device and the second electrode. The metal oxide pattern may include a first region and a second region, the first region encloses the second region, and the second region may have a contact hole exposing at least a portion of the second surface. The second electrode may be coupled to the second surface through the contact hole, and the first region and the second region may have crystalline phases different from each other.

According to an embodiment of the inventive concept, a display device may include a plurality of pixels and a light emitting device provided in each of the plurality of pixels. The light emitting device may include a first surface and a second surface, which are opposite to each other, and the light emitting device may include a first semiconductor layer of p-type, an active layer, and a second semiconductor layer of n-type, which are sequentially stacked. The first semiconductor layer may be adjacent to the first surface, and the second semiconductor layer may be adjacent to the second surface. The first surface may include a first region and a second region, which are edge and center regions thereof. The first surface may have a first width, and the second region may have a second width. A ratio of the second width to the first width may range from 0.7 to 0.9, and a density of threading dislocations may be higher in the first region than in the second region.

According to an embodiment of the inventive concept, a display device may include a plurality of pixels on a base layer, a first light emitting device and a second light emitting device that are provided on a first pixel, which is one of the pixels, each of the first and second light emitting devices having a first surface and a second surface, which are opposite to each other, a first electrode between the first and second light emitting devices and the base layer, a second electrode on the first and second light emitting devices, and a first metal oxide pattern and a second metal oxide pattern provided on the second surfaces of the first and second light emitting devices, respectively. The first and second surfaces of the first light emitting device may face the first and second electrodes, respectively, and the first and second surfaces of the second light emitting device may face the second and first electrodes, respectively. The first metal oxide pattern may be interposed between the second electrode and the second surface of the first light emitting device, and the second metal oxide pattern may be interposed between the first electrode and the second surface of the second light emitting device.

DETAILED DESCRIPTION

Figure 1:
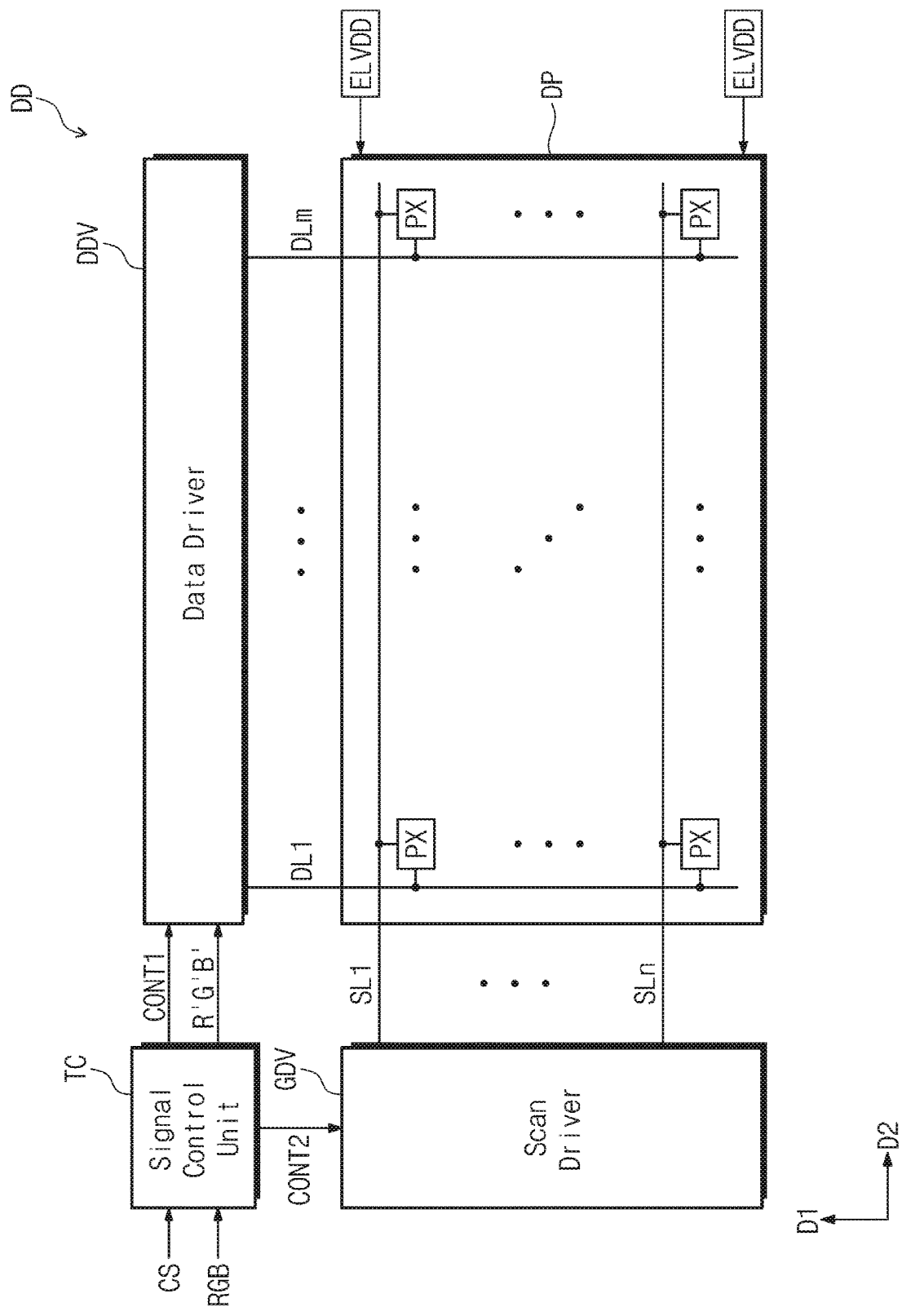
FIG. 1 is a block diagram illustrating a display device according to an embodiment of the inventive concept.

In order to sufficiently understand the configuration and effect of the inventive concept, some embodiments of the inventive concept will be described with reference to the accompanying drawings. It should be noted, however, that the inventive concept are not limited to the following exemplary embodiments, and may be implemented in various forms. Rather, the exemplary embodiments are provided only to disclose the inventive concept and let those skilled in the art fully know the scope of the inventive concept.

In this description, it will be understood that, when an element is referred to as being on another element, the element can be directly on the other element or intervening elements may be present therebetween. In the drawings, thicknesses of some components are exaggerated for effectively explaining the technical contents. Like reference numerals refer to like elements throughout the specification.

Some example embodiments detailed in this description will be discussed with reference to sectional and/or plan views as ideal exemplary views of the inventive concept. In the drawings, thicknesses of layers and regions are exaggerated for effectively explaining the technical contents. Accordingly, regions exemplarily illustrated in the drawings have general properties, and shapes of regions exemplarily illustrated in the drawings are used to exemplarily disclose specific shapes but not limited to the scope of the inventive concept. It will be understood that, although the terms "first", "second", "third", etc. may be used herein to describe various elements, these elements should not be limited by these terms. These terms are only used to distinguish one element from another element. The embodiments explained and illustrated herein include complementary embodiments thereof.

The terminology used herein is for the purpose of describing particular embodiments only and is not intended to limit the inventive concept. As used herein, the singular forms are intended to include the plural forms as well. The terms 'comprises/includes' and/or 'comprising/including' used in the specification do not exclude the presence or addition of one or more other components.

FIG. 1 is a block diagram illustrating a display device according to an embodiment of the inventive concept.

Referring to FIG. 1, a display device DD may include a display panel DP, a signal control unit TC or a timing controller, a data driver DDV, and a scan driver GDV. Each of the signal control unit TC, the data driver DDV, and the scan driver GDV may include a circuit.

The display panel DP may include a light emitting device. For example, the display panel DP may include a micro-LED. The display panel DP may include a plurality of data lines DL1 to DLm, a plurality of scan lines SL1 to SLn, and a plurality of pixels PX.

The data lines DL1 to DLm may be extended in a first direction D1. The data lines DL1 to DLm may be arranged in a second direction D2 crossing the first direction D1. The scan lines SL1 to SLn may be extended in the second direction D2. The scan lines SL1 to SLn may be arranged in the first direction D1.

Each of the pixels PX may include a light emitting device and a pixel circuit electrically connected to the light emitting device. The pixel circuit may include a plurality of transistors. A first power voltage ELVDD and a second power voltage ELVSS may be provided in each of the pixels PX.

The pixels PX may be arranged on a surface of the display panel DP, in a regular manner or with a specific arrangement rule. Each of the pixels PX may be configured to display one of primary colors or one of mixed colors. The primary colors may include red, green, and blue colors. The mixed colors may include yellow, cyan, magenta, and white colors. However, colors, which can be displayed by the pixels PX, are not limited to the above colors.

The signal control unit TC may receive an image data RGB provided from the outside. The signal control unit TC may be configured to convert the image data RGB to image data R'G'B', which are suitable for operations of the display panel DP, and to output the converted image data R'G'B' to the data driver DDV.

The signal control unit TC may receive a control signal CS provided from the outside. The control signal CS may include a vertical synchronization signal, a horizontal synchronization signal, a main clock signal, and a data enable signal. The signal control unit TC may provide a first control signal CONT1 to the data driver DDV and may provide a second control signal CONT2 to the scan driver GDV. The first control signal CONT1 may be used to control the data driver DDV, and the second control signal CONT2 may be used to control the scan driver GDV.

The data driver DDV may drive the data lines DL1 to DLm, in response to the first control signal CONT1 provided from the signal control unit TC. The data driver DDV may be provided in the form of a separate integrated circuit, and then it may be electrically connected to a portion of the display panel DP or may be directly mounted on the display panel DP. In an embodiment, the data driver DDV may be provided in the form of a single chip or a plurality of chips.

The scan driver GDV may drive the scan lines SL1 to SLn, in response to the second control signal CONT2 provided from the signal control unit TC. As an example, the scan driver GDV may be integrated on a region of the display panel DP. In this case, the scan driver GDV may include a plurality of thin-film transistors that are formed by the same process as that for a driving circuit of the pixel PX (e.g., by a low temperature polycrystalline silicon (LTPS) process or a low temperature polycrystalline oxide (LTPO) process). Alternatively, the scan driver GDV may be provided in the form of a separate integrated circuit chip and then may be electrically connected to a portion of the display panel DP.

In the case where one of the scan lines SL1 to SLn is applied with a gate-on voltage, switching transistors in a row of pixels connected thereto may be turned on. Here, the data driver DDV may provide data driving signals to the data lines DL1 to DLm. The data driving signals provided to the data lines DL1 to DLm may be applied to corresponding pixels through the turned-on switching transistors. The data driving signals may be analog voltages corresponding to gradation levels of the image data.

Figure 2:
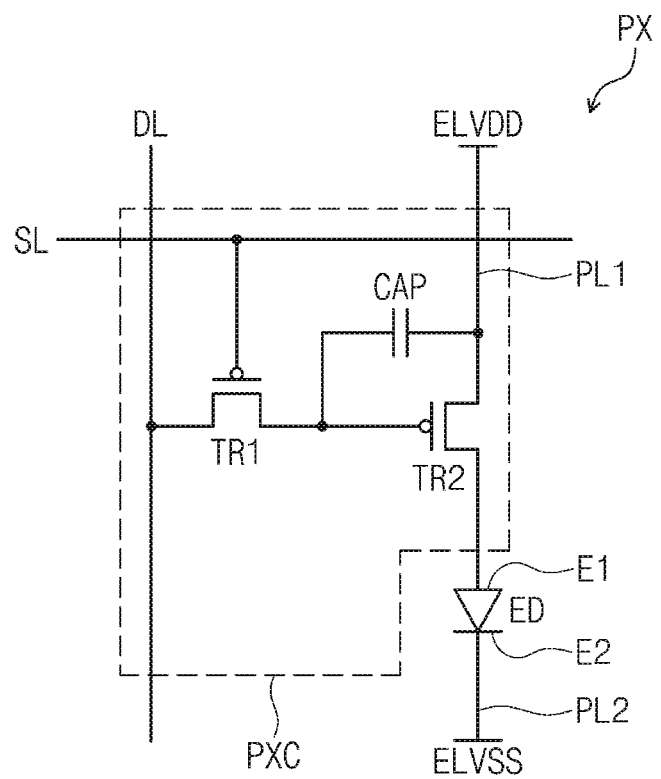
FIG. 2 is an equivalent circuit diagram illustrating a pixel according to an embodiment of the inventive concept.

FIG. 2 is an equivalent circuit diagram illustrating a pixel according to an embodiment of the inventive concept.

Referring to FIG. 2, the pixel PX may be connected to a plurality of signal lines. In the present embodiment, the signal lines may include a scan line SL, a data line DL, a first power line PL1, and a second power line PL2.

The pixel PX may include a light emitting device ED and a pixel circuit PXC. The pixel circuit PXC may include a first thin-film transistor TR1, a capacitor CAP, and a second thin-film transistor TR2.

The first thin-film transistor TR1 may be a switching transistor, which is used to control the on/off operation of the pixel PX. The first thin-film transistor TR1 may transmit or block a data signal transmitted through the data line DL, in response to a gate signal transmitted through the scan line GL.

The capacitor CAP may be provided between and connected to the first thin-film transistor TR1 and the first power line PL1. An amount of electric charges stored in the capacitor CAP may vary depending on a difference in voltage between the data signal transmitted from the first thin-film transistor TR1 and the first power voltage ELVDD applied to the first power line PL1.

The second thin-film transistor TR2 may be connected to the first thin-film transistor TR1, the capacitor CAP, and the light emitting device ED. The second thin-film transistor TR2 may control a driving current flowing through the light emitting device ED, based on the amount of charges stored in the capacitor CAP. For example, a turn-on time of the second thin-film transistor TR2 may be determined depending on the amount of charges stored in the capacitor CAP.

The first and second thin-film transistors TR1 and TR2 may be n-type or p-type thin-film transistors. Alternatively, at least one of the first and second thin-film transistors TR1 and TR2 may be an n-type thin-film transistor, and the other may be a p-type thin-film transistor.

The light emitting device ED may be provided between and connected to the second thin-film transistor TR2 and the second power line PL2. The light emitting device ED may emit light, when there is a difference in voltage between a signal transmitted through the second thin-film transistor TR2 and the second power voltage ELVSS received through the second power line PL2.

The light emitting device ED may be an ultra-small LED device. The ultra-small LED device may be an LED device whose size is in a range from several nano-meters to several hundreds of micro-meters. However, the size of the ultra-small LED device is merely illustrative example, and is not limited to the afore-mentioned size range.

An example, in which just one light emitting device ED is provided between the second thin-film transistor TR2 and the second power line PL2, is illustrated in FIG. 2, but, in an embodiment, a plurality of light emitting devices ED may be provided. The plurality of the light emitting devices ED may be connected in parallel to each other.

Figure 3:
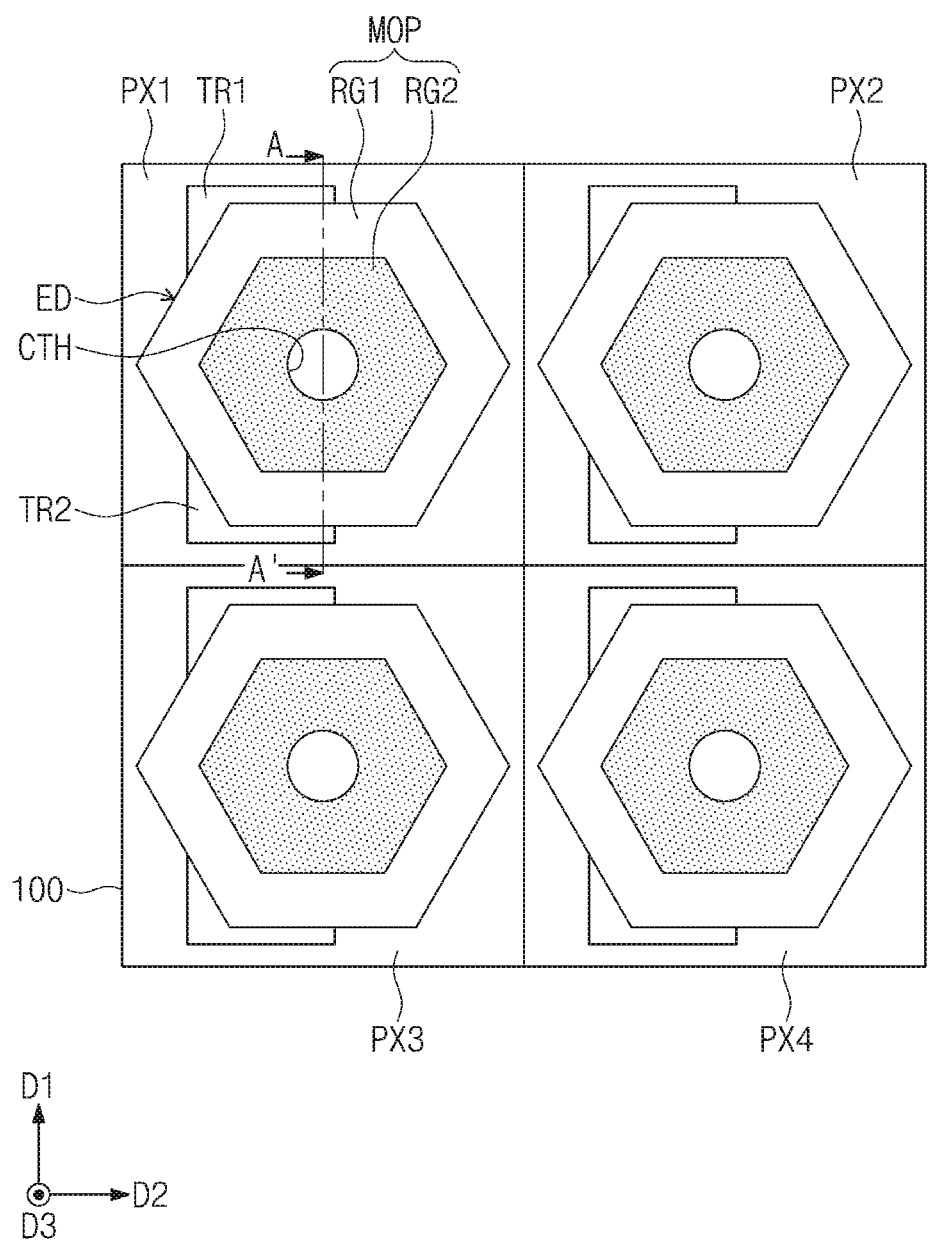
FIG. 3 is a plan view illustrating a display panel of a display device according to an embodiment of the inventive concept.
Figure 4:
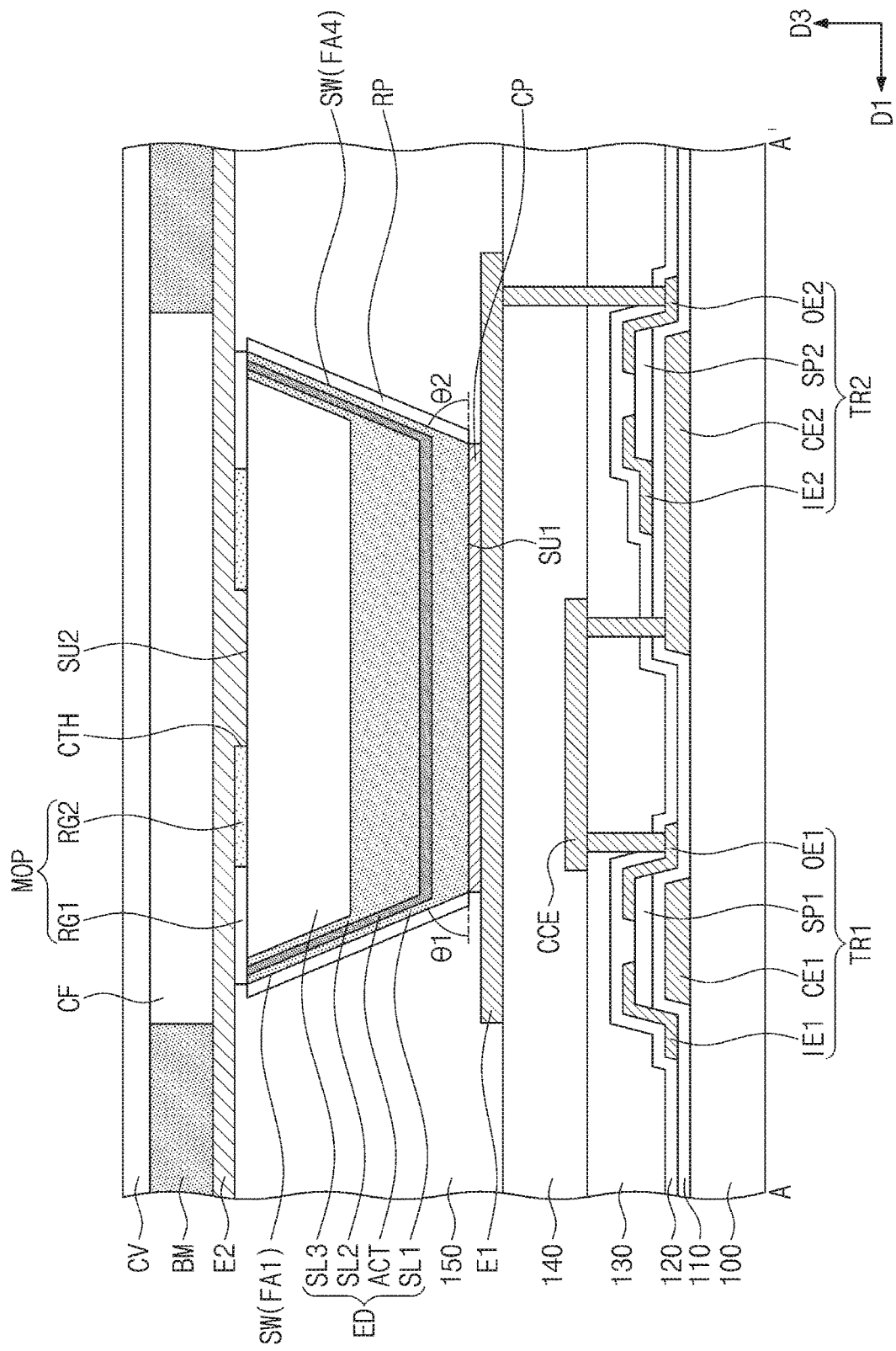
FIG. 4 is a sectional view taken along a line A-A' of FIG. 3.
Figure 5A:
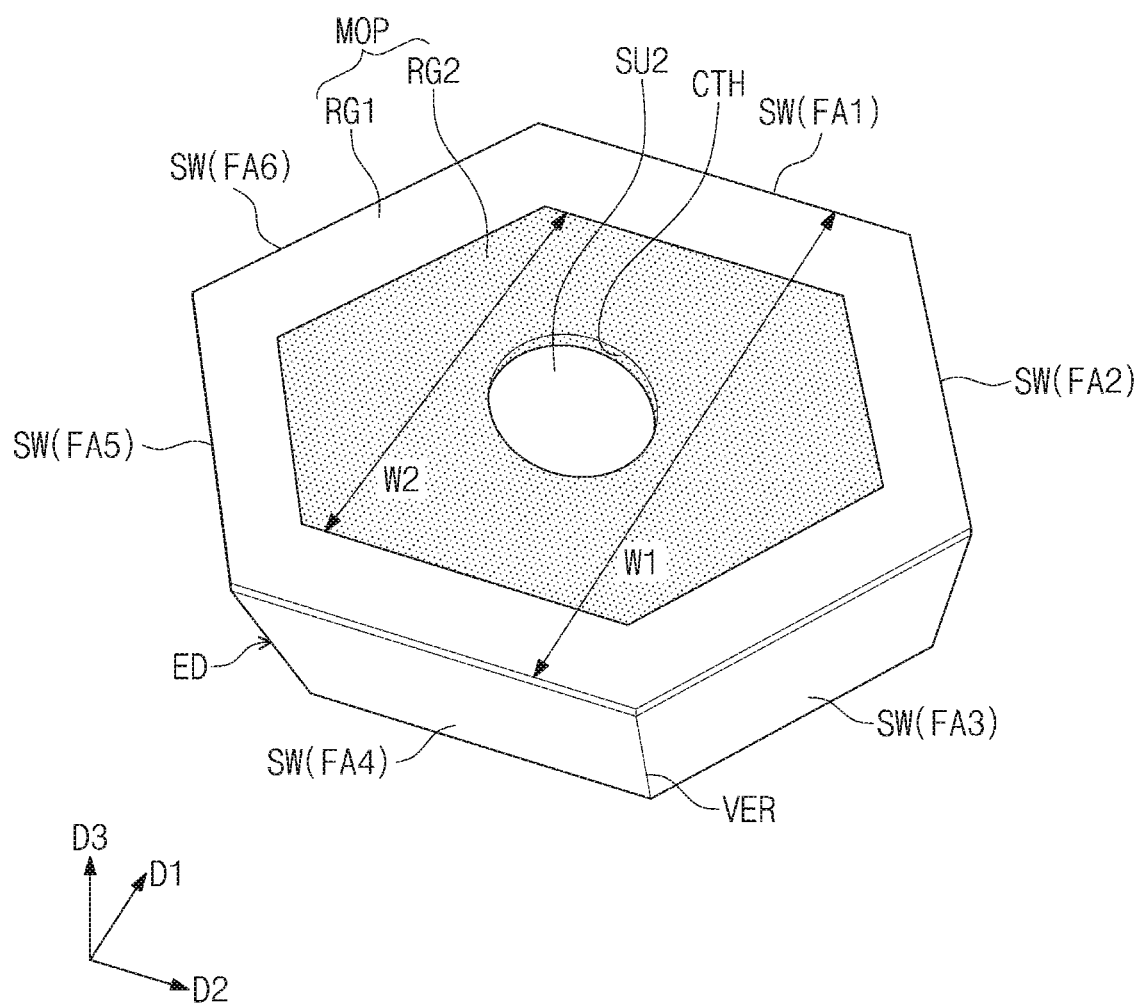
FIG. 5A is a perspective view illustrating a light emitting device of FIG. 3.
Figure 5B:
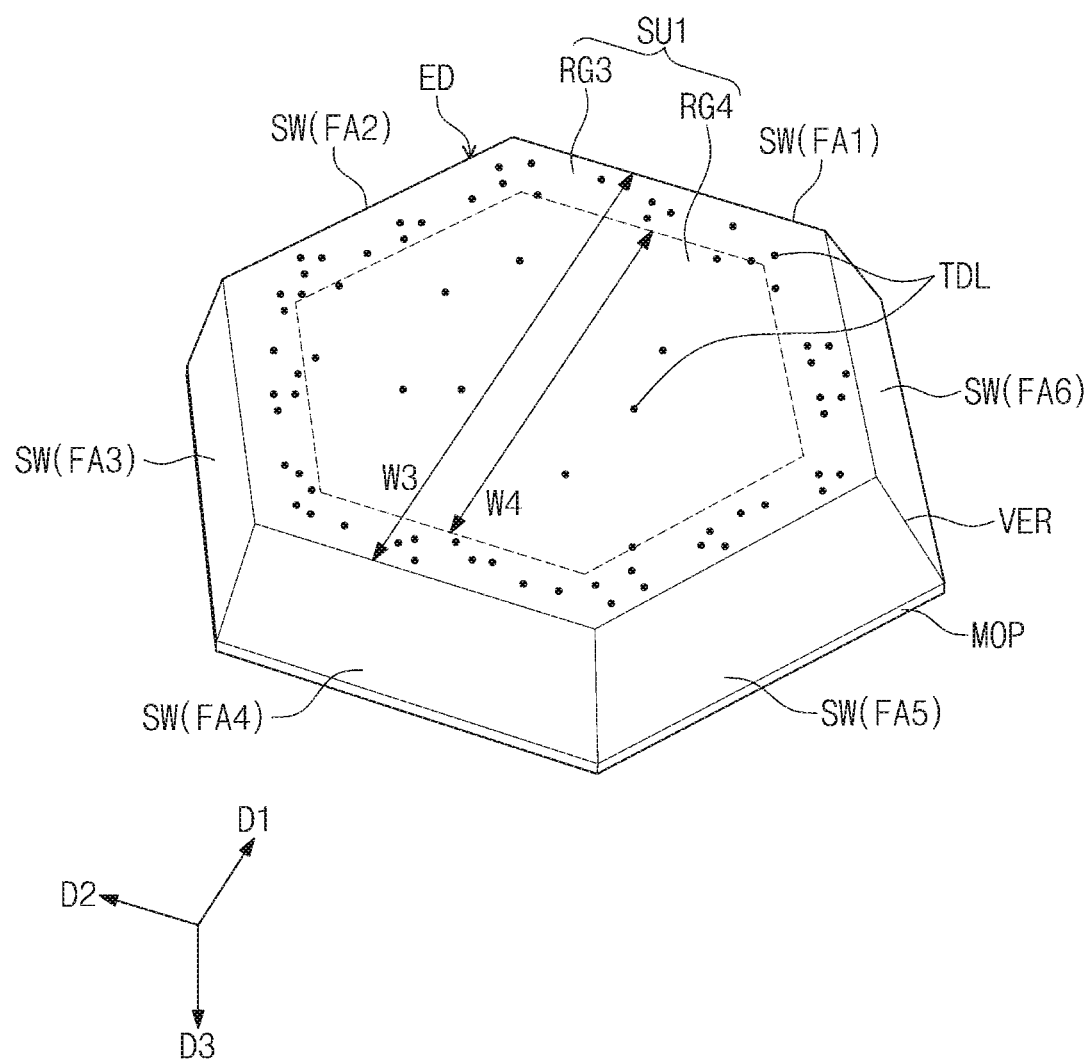
FIG. 5B is a perspective view illustrating an inverted structure of the light emitting device of FIG. 5A.

FIG. 3 is a plan view illustrating a display panel of a display device according to an embodiment of the inventive concept. FIG. 4 is a sectional view taken along a line A-A' of FIG. 3. FIG. 5A is a perspective view illustrating a light emitting device of FIG. 3. FIG. 5B is a perspective view illustrating an inverted structure of the light emitting device of FIG. 5A.

Referring to FIGS. 3, 4, 5A, and 5B, first to fourth pixels PX1 to PX4 may be provided on a base layer 100. The base layer 100 may include a silicon substrate, a plastic substrate, a glass substrate, an insulating film, or a stack including a plurality of insulating layers.

The first to fourth pixels PX1 to PX4 may be two-dimensionally arranged. The first and second pixels PX1 and PX2 may be adjacent to each other in the second direction D2, and the third and fourth pixels PX3 and PX4 may be adjacent to each other in the second direction D2. The first and third pixels PX1 and PX3 may be adjacent to each other in the first direction D1, and the second and fourth pixels PX2 and PX4 may be adjacent to each other in the first direction D1. Each of the first to fourth pixels PX1 to PX4 may include the first thin-film transistor TR1, the second thin-film transistor TR2, and the light emitting device ED. Hereinafter, one (e.g., the first pixel PX1) of the first to fourth pixels PX1 to PX4 will be exemplarily described.

The first and second thin-film transistors TR1 and TR2 may be disposed on the base layer 100. The first thin-film transistor TR1 may include a first control electrode CE1, a first input electrode IE1, a first output electrode OE1, and a first semiconductor pattern SP1. The second thin-film transistor TR2 may include a second control electrode CE2, a second input electrode IE2, a second output electrode OE2, and a second semiconductor pattern SP2.

The first control electrode CE1 and the second control electrode CE2 may be provided on the base layer 100. The first control electrode CE1 and the second control electrode CE2 may be formed of or include a conductive material. A first insulating layer 110 may be provided on the base layer 100 to cover the first control electrode CE1 and the second control electrode CE2. In other words, the first control electrode CE1 and the second control electrode CE2 may be interposed between the first insulating layer 110 and the base layer 100.

The first semiconductor pattern SP1 and the second semiconductor pattern SP2 may be provided on the first insulating layer 110. Each of the first and second semiconductor patterns SP1 and SP2 may be formed of or include a semiconductor material. For example, the semiconductor material may include at least one of amorphous silicon, poly silicon, single-crystalline silicon, oxide semiconductor materials, or compound semiconductor materials. Each of the first and second semiconductor patterns SP1 and SP2 may include a channel region, which is used as a conduction path of electrons or holes, and a first impurity region and a second impurity region, which are spaced apart from each other with the channel region interposed therebetween.

The first input electrode IE1 and the first output electrode OE1 may be provided on the first semiconductor pattern SP1. The first input electrode IE1 and the first output electrode OE1 may be respectively connected to the first and second impurity regions of the first semiconductor pattern SP1. The second input electrode IE2 and the second output electrode OE2 may be provided on the second semiconductor pattern SP2. The second input electrode IE2 and the second output electrode OE2 may be respectively connected to the first and second impurity regions of the second semiconductor pattern SP2.

A second insulating layer 120 may be provided on the first insulating layer 110 to cover the first and second semiconductor patterns SP1 and SP2, the first and second input electrodes IE1 and IE2, and the first and second output electrodes OE1 and OE2. In other words, the first and second semiconductor patterns SP1 and SP2, the first and second input electrodes IE1 and IE2, and the first and second output electrodes OE1 and OE2 may be interposed between the first insulating layer 110 and the second insulating layer 120.

A third insulating layer 130 may be provided on the second insulating layer 120. The third insulating layer 130 may have a substantially flat top surface. A connection electrode CCE may be disposed on the third insulating layer 130 to electrically connect the first output electrode OE1 to the second control electrode CE2. The connection electrode CCE may include a first contact, which is provided to penetrate the second and third insulating layers 120 and 130 and is coupled to the first output electrode OE1. In addition, the connection electrode CCE may include a second contact, which is provided to penetrate the first to third insulating layers 110, 120, and 130 and is coupled to the second control electrode CE2.

A fourth insulating layer 140 may be provided on the third insulating layer 130 to cover the connection electrode CCE. A first electrode E1 may be provided on the fourth insulating layer 140. The first electrode E1 may include a third contact, which is provided to penetrate the second to fourth insulating layers 120, 130, and 140 and is coupled to the second output electrode OE2.

A fifth insulating layer 150 may be provided on the fourth insulating layer 140 to cover the first electrode E1. The light emitting device ED may be provided on the first electrode E1. The light emitting device ED may be provided in the fifth insulating layer 150. The light emitting device ED may have a first surface SU1 and a second surface SU2, which are opposite to each other in a third direction D3. As an example, the first surface SU1 may be a bottom surface of the light emitting device ED, and the second surface SU2 may be a top surface of the light emitting device ED. An area of the first surface SU1 may be smaller than an area of the second surface SU2. In an embodiment, a p-type semiconductor layer of the light emitting device ED may be adjacent to the first surface SU1, and an n-type semiconductor layer of the light emitting device ED may be adjacent to the second surface SU2.

A connection pattern CP may be interposed between the light emitting device ED and the first electrode E1. The connection pattern CP may be provided on the first surface SU1 of the light emitting device ED. The connection pattern CP may be formed of or include at least one of metallic materials (e.g., Ni, Au, alloys of Ni and Au, or a multilayer of Ni/Au layers) having a low melting temperature.

The light emitting device ED and the first electrode E1 may be electrically connected to each other through the connection pattern CP. For example, the light emitting device ED may include a first semiconductor layer SL1, as will be described below, and the first electrode E1 may be connected to the first semiconductor layer SL1 of the light emitting device ED. The first electrode E1 may be electrically connected to the first power line PL1 previously described with reference to FIG. 2. In other words, the first power voltage ELVDD of FIG. 2 may be applied to the first electrode E1.

The light emitting device ED may include a first semiconductor layer SL1, an active layer ACT, a second semiconductor layer SL2, and a third semiconductor layer SL3, which are sequentially stacked. The active layer ACT and the first to third semiconductor layers SL1, SL2, and SL3 may be formed of or include at least one of III-V compound semiconductor materials. The active layer ACT and the first to third semiconductor layers SL1, SL2, and SL3 may be formed of or include at least one of GaN-based semiconductor materials. In an embodiment, the active layer ACT and the first to third semiconductor layers SL1, SL2, and SL3 may be formed of or include at least one of GaN, AlN, AlGaN, InGaN, InN, InAlGaN, AlInN, or combinations thereof.

The first to third semiconductor layers SL1, SL2, and SL3 may be formed of or include the same GaN semiconductor material. As an example, the first to third semiconductor layers SL1, SL2, and SL3 may be formed of or include GaN. The first semiconductor layer SL1 may be a p-type semiconductor layer. The first semiconductor layer SL1 may contain an impurity, such as magnesium (Mg), zinc (Zn), calcium (Ca), strontium (Sr), or barium (Ba). The second semiconductor layer SL2 may be an n-type semiconductor layer. The second semiconductor layer SL2 may contain an impurity, such as silicon (Si), germanium (Ge), tin (Sn), selenium (Se), or tellurium (Te). The third semiconductor layer SL3 may be an undoped semiconductor layer.

The active layer ACT may be interposed between the first semiconductor layer SL1 and the second semiconductor layer SL2. The active layer ACT may be a region, in which holes injected through the first semiconductor layer SL1 are recombined with electrons injected through the second semiconductor layer SL2. As a result of the electron-hole recombination, light may be emitted from the active layer ACT. The active layer ACT may have at least one of a single quantum well structure, a multiple quantum well structure, a quantum wire structure, or a quantum dot structure. As an example, the active layer ACT may have a multiple quantum well structure containing InGaN and GaN.

The first semiconductor layer SL1, the active layer ACT, the second semiconductor layer SL2, and the third semiconductor layer SL3 may be sequentially stacked on the first surface SU1 of the light emitting device ED. Furthermore, the first semiconductor layer SL1, the active layer ACT, the second semiconductor layer SL2, and the third semiconductor layer SL3 may be sequentially stacked on a sidewall SW of the light emitting device ED. In other words, each of the first semiconductor layer SL1, the active layer ACT, and the second semiconductor layer SL2 may have a 'U'-shaped section. Each of the first semiconductor layer SL1, the active layer ACT, and the second semiconductor layer SL2 may have a shape enclosing bottom and side surfaces of the third semiconductor layer SL3.

The active layer ACT adjacent to the sidewall SW of the light emitting device ED may be interposed between the first semiconductor layer SL1 and the second semiconductor layer SL2. In other words, the active layer ACT adjacent to the sidewall SW of the light emitting device ED may be veiled by the first semiconductor layer SL1 and may not be exposed to the outside. The first semiconductor layer SL1 adjacent to the sidewall SW of the light emitting device ED may passivate the active layer ACT. Since the active layer ACT is protected by the first semiconductor layer SL1, electric characteristics of the active layer ACT may be improved, and thus, light-emitting efficiency of the light emitting device ED may be improved.

A thickness of the first semiconductor layer SL1 in the third direction D3 may be larger than a thickness of the first semiconductor layer SL1 on the sidewall SW of the light emitting device ED. A thickness of the second semiconductor layer SL2 in the third direction D3 may be larger than a thickness of the second semiconductor layer SL2 on the sidewall SW of the light emitting device ED. This is because a GaN growth rate in the third direction D3 is highest in a growth process of the light emitting device ED, which will be described below.

When viewed in a plan view, the light emitting device ED may have a hexagonal shape. The light emitting device ED may have a truncated-inverted-pyramid shape. The light emitting device ED may be a truncated polygonal pillar shape (e.g., see FIGS. 5A and 5B).

The light emitting device ED may further have the sidewall SW, which is slantingly extended from the first surface SU1 to the second surface SU2. The sidewall SW may include first to sixth facets FA1-FA6. The first to sixth facets FA1-FA6 may be sequentially arranged along six sides of the second surface SU2 in a clockwise direction (e.g., see FIG. 5A). The first to sixth facets FA1-FA6 may be sequentially arranged along six sides of the first surface SU1 in a counterclockwise direction (e.g., see FIG. 5B).

The sidewall SW of the light emitting device ED may further include a vertex VER. The vertex VER may be defined by two adjacent ones of the first to sixth facets FA1-FA6 meeting each other. The vertex VER may be extended from the first surface SU1 of the light emitting device ED to the second surface SU2 (e.g., see FIG. 5A).

The light emitting device ED may have a wurtzite crystal structure. Each of the first and second surfaces SU1 and SU2 of the light emitting device ED may be a c-plane that is a polar plane. Each of the first and second surfaces SU1 and SU2 may be a {0001} facet. The polar plane or the c-plane may be a surface that is made up of only one kind of atoms.

In an embodiment, the polar plane or the c-plane may be a surface that is made up of only gallium (Ga) atoms or only nitrogen (N) atoms.

Each of the first to sixth facets FA1-FA6 may be inclined at an angle to the first and second surfaces SU1 and SU2. In an embodiment, the first to sixth facets FA1-FA6 may have the same angle. In other words, the first to sixth facets FA1-FA6 may be inclined at the same angle to the first surface SU1. For example, referring to FIG. 4, the first facet FA1 may be inclined at a first angle θ1 to the first surface SU1, and the fourth facet FA4 may be inclined at a second angle θ2 to the first surface SU1. Here, the first angle θ1 and the second angle θ2 may be substantially equal to each other. Due to the inclined profile of the first to sixth facets FA1-FA6, a width of the light emitting device ED may increase with increasing distance from the base layer 100.

Alternatively, at least one of the first to sixth facets FA1-FA6 may be inclined at an angle to the others of the facets. For example, the first and second angles θ1 and θ2 described above may be different from each other.

Each of the first to sixth facets FA1-FA6 of the light emitting device ED may be a semi-polar plane. For example, each of the first to sixth facets FA1-FA6 may be a {n −n 0 k} facet. Here, each of indices n and k is an integer of 1 or greater. In an embodiment, each of the first to sixth facets FA1-FA6 may be a {1 −1 0 1} facet. In another embodiment, each of the first to sixth facets FA1-FA6 may be a {n 0 −n k} facet or a {n n −2n k} facet. Here, each of indices n and k is an integer of 1 or greater.

If the sidewall SW of the light emitting device ED is a surface that is perpendicular to the first surface SU1 (e.g., if the angles θ1 and θ2 are about 90°), light generated in the active layer ACT may be leaked through the sidewall SW, and in this case, the light extraction efficiency may be reduced. However, according to an embodiment of the inventive concept, since the light emitting device ED has the sidewall SW that is inclined at an angle, it may be possible to effectively prevent the light from being leaked through the sidewall SW. Accordingly, the light emitting device ED may have high light extraction efficiency.

Referring back to FIG. 5B, the first surface SU1 of the light emitting device ED may include an edge region (hereinafter, a third region RG3) and a center region (hereinafter, a fourth region RG4). The third region RG3 of the first surface SU1 may be adjacent to the first to sixth facets FA1-FA6. The fourth region RG4 of the first surface SU1 may be enclosed by the third region RG3. In an embodiment, a ratio of an area of the fourth region RG4 to a total area of the first surface SU1 may range from 0.5 to 0.8.

The first surface SU1 may have a third width W3 in the first direction D1. The fourth region RG4 may have a fourth width W4 in the first direction D1. A ratio of the fourth width W4 to the third width W3 (i.e., W4/W3) may range from 0.7 to 0.9. The fourth region RG4 may be vertically overlapped with a second region RG2 of a metal oxide pattern MOP, which will be described below. The remaining region of the first surface SU1, except the fourth region RG4, may be the third region RG3.

Threading dislocations TDL in the light emitting device ED may be extended to appear on the first surface SU1 of the light emitting device ED. The threading dislocations TDL may be crystal defects in the light emitting device ED, and in the case where a density of the threading dislocations TDL in the light emitting device ED is high, the light-emitting efficiency of the light emitting device ED may be lowered.

According to an embodiment of the inventive concept, the density of the threading dislocations TDL may be lower in the fourth region RG4 of the first surface SU1 than in the third region RG3 of the first surface SU1. That is, according to an embodiment of the inventive concept, the density of the threading dislocations TDL may be relatively low at a center region of the light emitting device ED.

According to an embodiment of the inventive concept, the density of the threading dislocations TDL, which is given as a count of the number of the threading dislocations TDL per unit area on the first surface SU1, may have a relatively low small value. For example, in the light emitting device ED, the density of the threading dislocation may range from $3 \times 10^6 / cm^2$ to $3 \times 10^8 / cm^2$.

Referring back to FIGS. 3, 4, 5A, and 5B, a reflection pattern RP may be interposed between the light emitting device ED and the fifth insulating layer 150. The reflection pattern RP may directly cover the sidewall SW of the light emitting device ED. The reflection pattern RP may prevent the light, which is generated in the active layer ACT, from being leaked through the sidewall SW of the light emitting device ED. In other words, the reflection pattern RP may be configured to reflect the light, which is generated in the active layer ACT, and to guide the light to the second surface SU2 of the light emitting device ED, and thus, the light may be emitted through the second surface SU2 of the light emitting device ED.

A metal oxide pattern MOP may be provided on the second surface SU2 of the light emitting device ED. The metal oxide pattern MOP may directly cover the second surface SU2 of the light emitting device ED. In an embodiment, the metal oxide pattern MOP may be provided to fully cover the second surface SU2. In another embodiment, the metal oxide pattern MOP may be provided to cover a portion of the second surface SU2 and to expose the remaining portion of the second surface SU2. The metal oxide pattern MOP may be formed of or include at least one of insulating materials such as metal oxides, and in an embodiment, the metal oxide pattern MOP may be formed of or include aluminum oxide (i.e., alumina) The metal oxide pattern MOP may be used as a passivation layer covering the second surface SU2.

The metal oxide pattern MOP may include an edge region (hereinafter, a first region RG1) and a center region (hereinafter, a second region RG2). The first region RG1 of the metal oxide pattern MOP may be adjacent to the first to sixth facets FA1-FA6. A contact hole CTH may be defined in a center of the second region RG2 of the metal oxide pattern MOP. The contact hole CTH may be provided to penetrate the second region RG2 of the metal oxide pattern MOP and to expose at least a portion of the second surface SU2 of the light emitting device ED. The first region RG1 may enclose the second region RG2. In an embodiment, a ratio of an area of the second region RG2 to a total area of the metal oxide pattern MOP may range from 0.2 to 0.7.

The metal oxide pattern MOP may have a first width W1 in the first direction D1. The second region RG2 may have a second width W2 in the first direction D1. A ratio of the second width W2 to the first width W1 (i.e., W2/W1) may range from 0.4 to 0.8. The remaining region of the metal oxide pattern MOP, except the second region RG2, may be the first region RG1.

The first and second regions RG1 and RG2 of the metal oxide pattern MOP may have crystalline phases different from each other. For example, the first region RG1 of the metal oxide pattern MOP may have a single crystalline α-phase. The second region RG2 of the metal oxide pattern MOP may have a polycrystalline γ-phase. Although the first and second regions RG1 and RG2 of the metal oxide pattern MOP have different crystalline phases, they may be formed of or include the same material (e.g., $Al_2O_3$) and may have the same thickness.

The first region RG1 of the metal oxide pattern MOP may have a higher density than the second region RG2 of the metal oxide pattern MOP. For example, the density of the first region RG1 of the metal oxide pattern MOP may be 3.97 $g/cm^3$, and the density of the second region RG2 of the metal oxide pattern MOP may be 3.65 $g/cm^3$.

The first region RG1 of the metal oxide pattern MOP may have a cubic crystal structure, whereas the second region RG2 may have a rhombohedral crystal structure. Accordingly, there may be a difference in diffraction pattern between the first and second regions RG1 and RG2 of the metal oxide pattern MOP.

A crystallization temperature of the first region RG1 of the metal oxide pattern MOP may be different from a crystallization temperature of the second region RG2. The crystallization temperature of the first region RG1 may be higher than the crystallization temperature of the second region RG2. For example, the crystallization temperature of the first region RG1 may be about 1200° C., and the crystallization temperature of the second region RG2 may be about 500° C.

A second electrode E2 may be provided on the fifth insulating layer 150. The second electrode E2 may be extended in the first direction D1, on a top surface of the metal oxide pattern MOP. The second electrode E2 may be connected to the second surface SU2 of the light emitting device ED through the contact hole CTH of the metal oxide pattern MOP. In other words, the second electrode E2 may be electrically connected to the third semiconductor layer SL3 of the light emitting device ED through the contact hole CTH. The second electrode E2 may be electrically connected to the second power line PL2 previously described with reference to FIG. 2. In other words, the second power voltage ELVSS of FIG. 2 may be applied to the second electrode E2.

Each of the first and second electrodes E1 and E2 may be formed of or include at least one of conductive materials. The conductive materials may include indium zinc oxide (IZO), indium tin oxide (ITO), indium gallium oxide (IGO), indium zinc gallium oxide (IGZO), or combinations thereof. However, the inventive concept is not limited to this example. Alternatively, the conductive materials may include metallic materials including molybdenum, silver, titanium, copper, aluminum, or alloys thereof.

An electrical signal may be applied to the first surface SU1 of the light emitting device ED through the first electrode E1 and the connection pattern CP. The connection pattern CP may be in contact with the first surface SU1 of the light emitting device ED, but not the sidewall SW of the light emitting device ED. Thus, the electrical signal, which is applied to the first electrode E1, may not be supplied to the sidewall SW of the light emitting device ED.

The second electrode E2 may be spaced apart from a portion of the second surface SU2 of the light emitting device ED by the metal oxide pattern MOP, which is an insulating material. The second electrode E2 may be in contact with only a center region of the second surface SU2, which is exposed through the contact hole CTH. Accordingly, an electrical signal, which is provided to the second electrode E2, may be locally applied to only the center region of the second surface SU2.

Thus, according to an embodiment of the inventive concept, a current between the first and second electrodes E1 and E2 may flow from the first surface SU1 of the light emitting device ED toward the second surface SU2 in a vertical direction (i.e., the third direction D3).

In the light emitting device ED, light may be mainly generated in the c-plane, which is the polar plane. In an embodiment, since the current flows from the first surface SU1 (i.e., the c-plane) toward the second surface SU2 (i.e., the c-plane), the current may be concentrated on the c-planes in the light emitting device ED. Thus, the light-emitting efficiency of the light emitting device ED may be improved. Furthermore, it may be possible to prevent a current from being leaked through an edge region of the second surface SU2 or the sidewall SW of the light emitting device ED, and this reduction of the leakage current may make it possible to further improve the light-emitting efficiency of the light emitting device ED.

Due to the position of the contact hole CTH, a main current path may be formed from the center region of the light emitting device ED in a vertical direction (e.g., the third direction D3). This may make it possible to further improve the light-emitting efficiency of the light emitting device ED, because the threading dislocation density has a relatively low value at the center region of the light emitting device ED, as described above.

A light-blocking pattern BM and a color filter CF may be provided on the second electrode E2. The light-blocking pattern BM may have an opening, which is vertically overlapped with the light emitting device ED, and the color filter CF may be provided in the opening. The light-blocking pattern BM may be a black matrix.

The color filter CF may include at least one of a red color filter, a green color filter, or a blue color filter. The color filter CF may be configured to transmit only light of a specific wavelength, among the light emitted from the light emitting device ED. As an example, the color filter CF may include quantum dots. That is, the color filter CF may be a quantum dot color filter.

As an example, the color filter CF may include a transparent material. If the light emitted from the light emitting device ED is a blue light, the color filter CF of a blue pixel may include only a transparent material, without a quantum dot.

A cover layer CV may be provided on the light-blocking pattern BM and the color filter CF. The cover layer CV may be formed of or include transparent glass or transparent plastic. The cover layer CV may protect the color filter CF and the light emitting device ED.

The light emitting device ED according to the present embodiments may have a honeycomb shape, when viewed in a plan view. Thus, it may be possible to two-dimensionally and efficiently dispose the light emitting devices ED on a display panel. In other words, an integration density of the light emitting devices ED on the display panel may be increased. Furthermore, due to its honeycomb shape, the light emitting device ED according to the present embodiments may be applicable to a flexible display device.

FIGS. 6, 8, 10, 12, 14, 16, and 18 are plan views illustrating a method of manufacturing a light emitting device, according to an embodiment of the inventive concept. FIGS. 7, 9, 11, 13, 15, 17, and 19 are sectional views taken along lines A-A' of FIGS. 6, 8, 10, 12, 14, 16, and 18, respectively.

Figure 6:
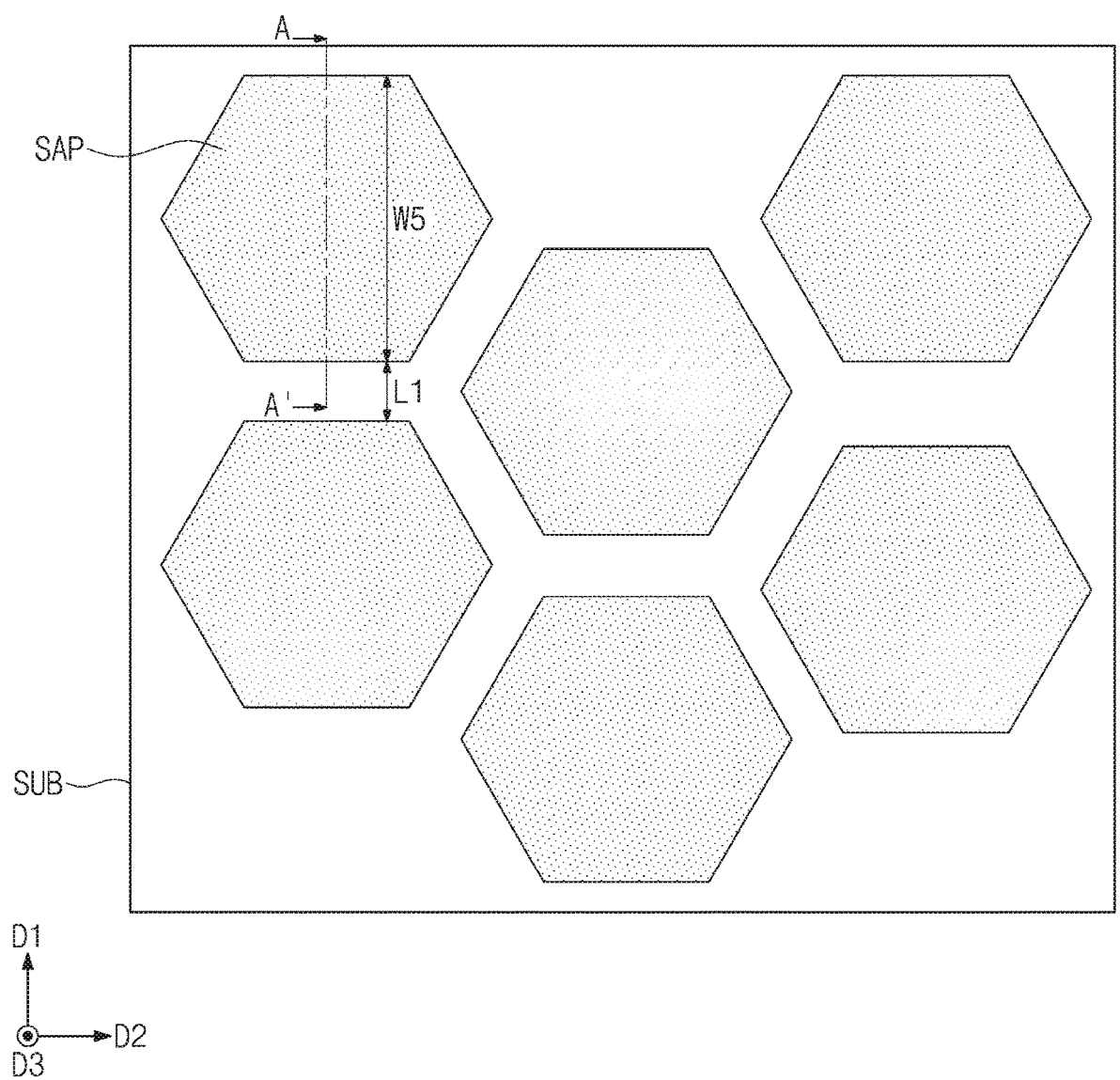
FIGS. 6, 8, 10, 12, 14, 16, and 18 are plan views illustrating a method of manufacturing a light emitting device, according to an embodiment of the inventive concept.
Figure 7:
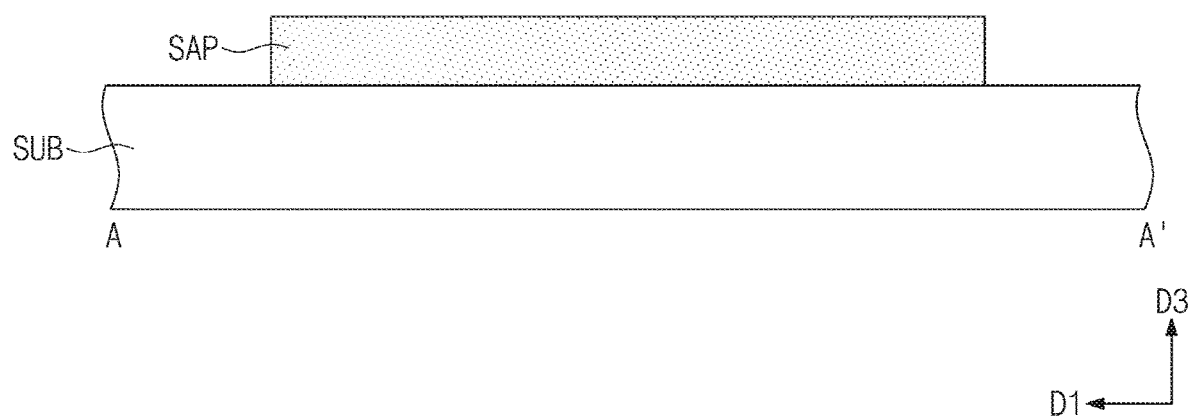
FIGS. 7, 9, 11, 13, 15, 17, and 19 are sectional views taken along lines A-A' of FIGS. 6, 8, 10, 12, 14, 16, and 18, respectively.

Referring to FIGS. 6 and 7, a plurality of sacrificial patterns SAP may be formed on a substrate SUB. The substrate SUB may be a sapphire substrate, a silicon substrate, a SiC substrate, or a GaAs substrate. As an example, the substrate SUB may be a sapphire substrate. For example, the substrate SUB may be formed of or include alumina of single-crystalline α-phase.

The formation of the sacrificial patterns SAP may include forming a photoresist layer on the substrate SUB and performing exposing and developing processes on the photoresist layer. In other words, the sacrificial patterns SAP may include a photoresist material. The sacrificial patterns SAP may be two-dimensionally arranged on the substrate SUB.

When viewed in a plan view, each of the sacrificial patterns SAP may be provided to have a shape of regular hexagon. An angle between adjacent sides of the sacrificial pattern SAP may be about 120°. In other words, the sacrificial patterns SAP may be arranged to form a honeycomb shape.

Each of the sacrificial patterns SAP may have a fifth width W5 in the first direction DE The shortest distance between adjacent ones of the sacrificial patterns SAP may be a first length L1. Here, a ratio of the first length L1 to the fifth width W5 may range from 0.01 to 0.2. In an embodiment, if the fifth width W5 has a relatively small value of about 5 μm, the first length L1 may be about 500 nm. In other words, in the method of manufacturing a light emitting device according to an embodiment of the inventive concept, even when a size of the light emitting device is smaller and smaller, the conventional cutting process may not be used for separation of light emitting devices, and thus, it may be possible to overcome a limitation in kerf loss.

Figure 8:
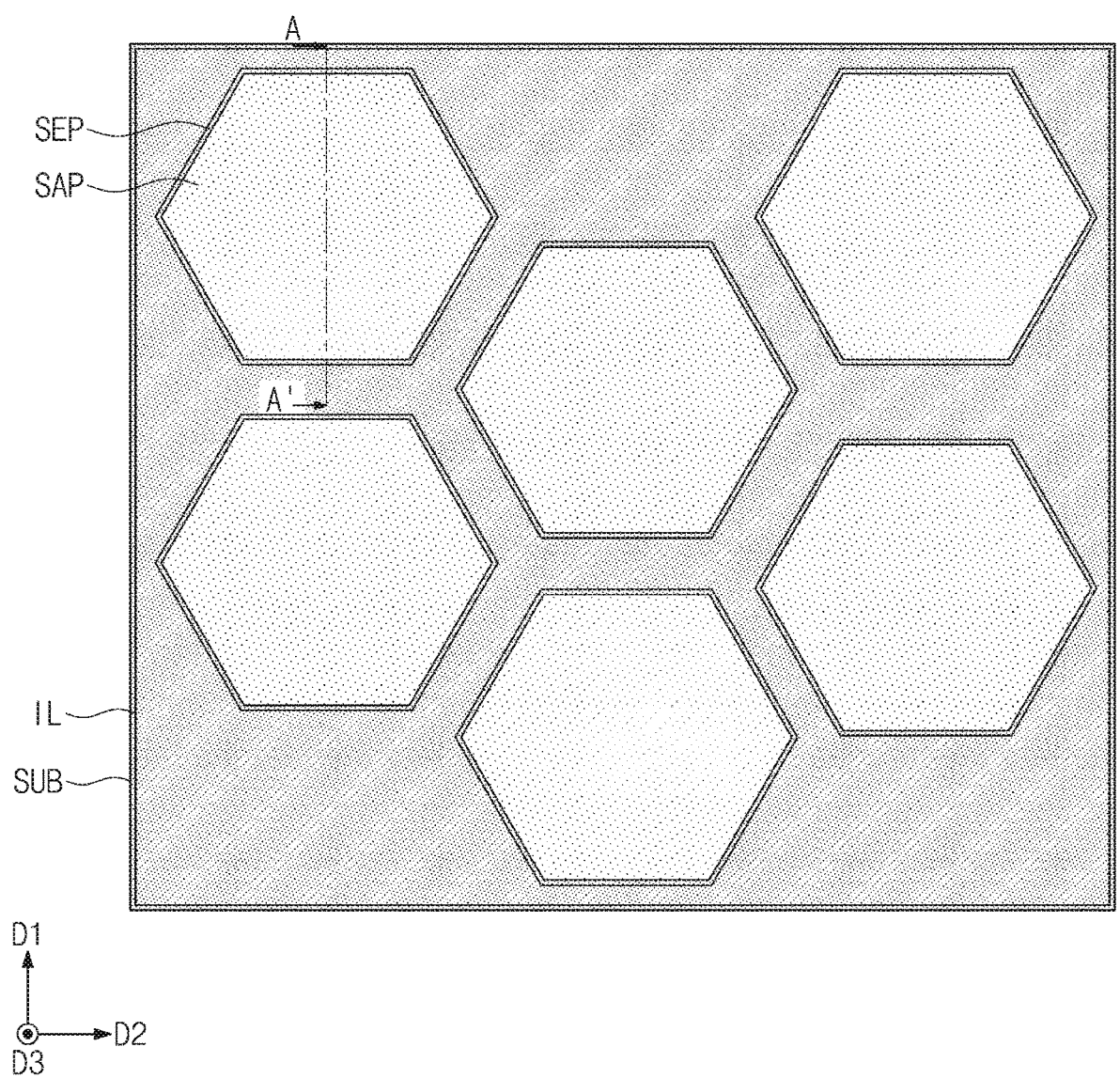
Figure 9:
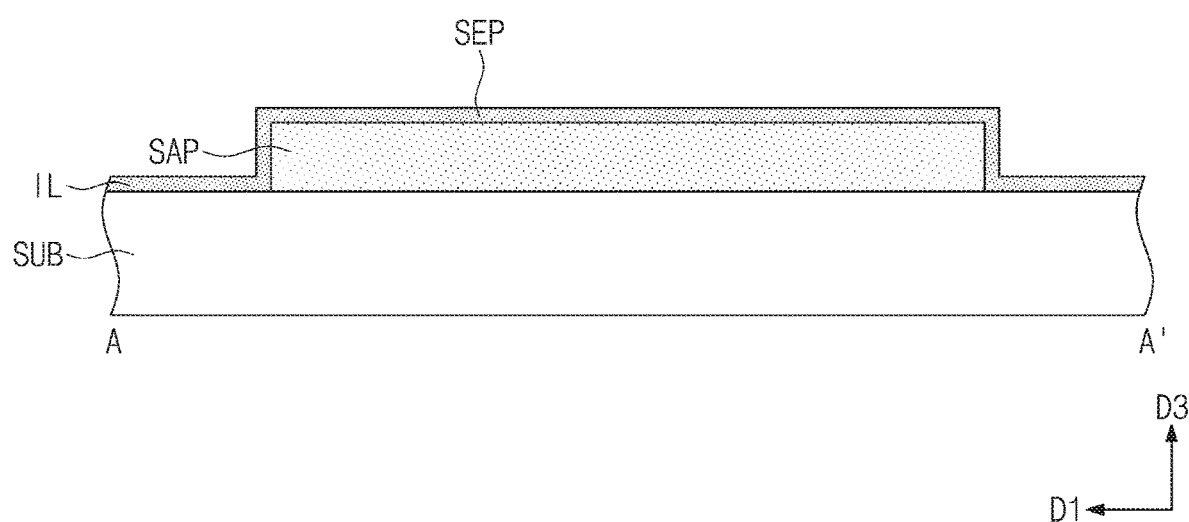

Referring to FIGS. 8 and 9, an inorganic layer IL may be conformally formed on the substrate SUB. The formation of the inorganic layer IL may include performing an atomic layer deposition process or a chemical vapor deposition process. The inorganic layer IL may be formed of or include at least one of silica ($SiO_2$), alumina ($Al_2O_3$), titania ($TiO_2$), zirconia ($ZrO_2$), yttria ($Y_2O_3$)-zirconia, copper oxide, tantalum oxide, aluminum nitride (AlN), or silicon nitride ($Si_3N_4$). As an example, the inorganic layer IL may be formed of or include amorphous alumina.

The inorganic layer IL may cover a top surface of the substrate SUB and a surface of each of the sacrificial patterns SAP. In other words, a portion of the inorganic layer IL may cover the surface of the sacrificial pattern SAP. The inorganic layer IL covering the surface of the sacrificial pattern SAP may be defined as a seed pattern SEP.

A planar shape of the seed pattern SEP may be determined by the sacrificial pattern SAP. For example, the seed pattern SEP may have substantially the same planar shape as the sacrificial pattern SAP. Thus, the planar shape of the seed pattern SEP may be hexagonal.

Figure 10:
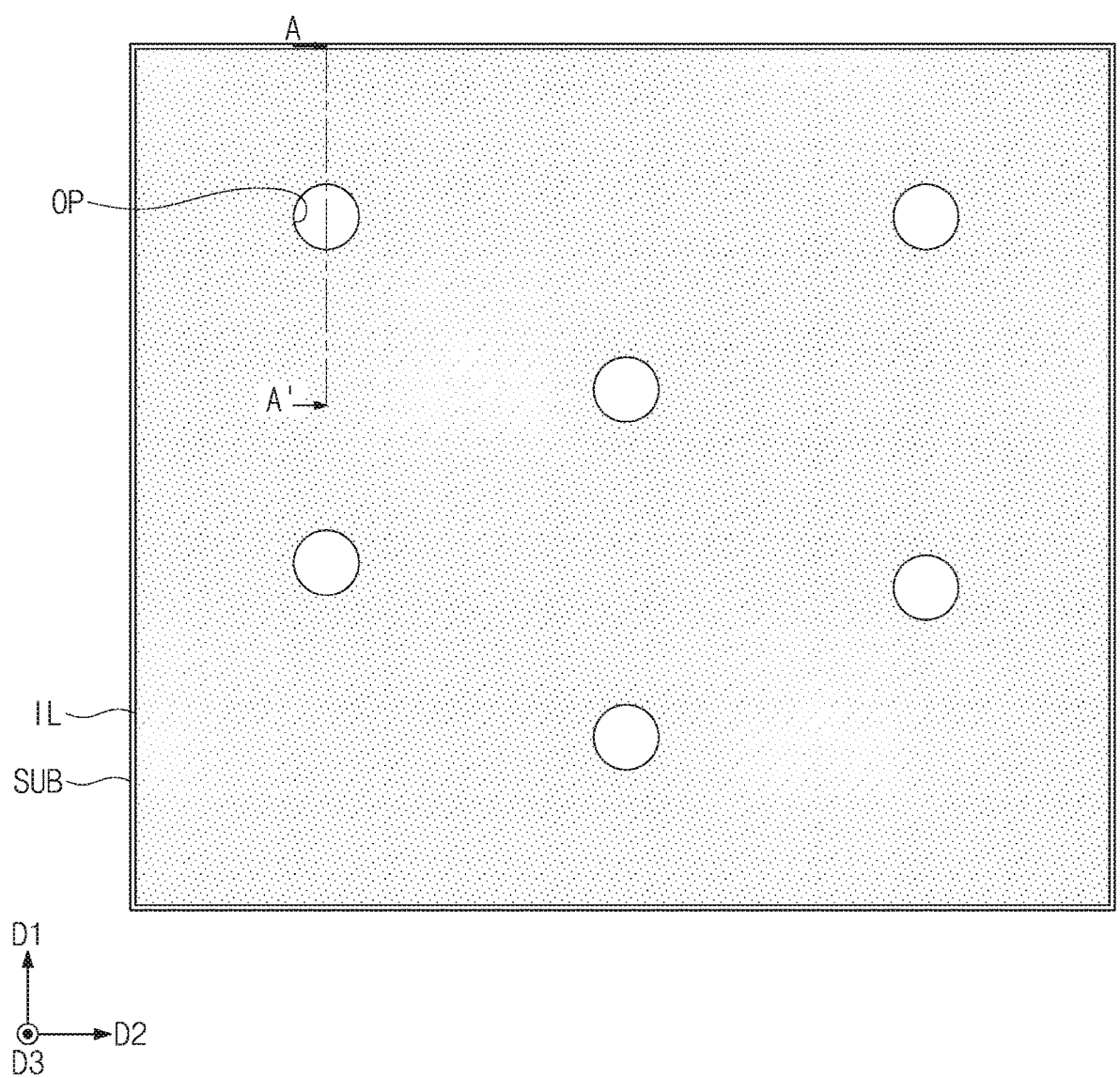
Figure 11:
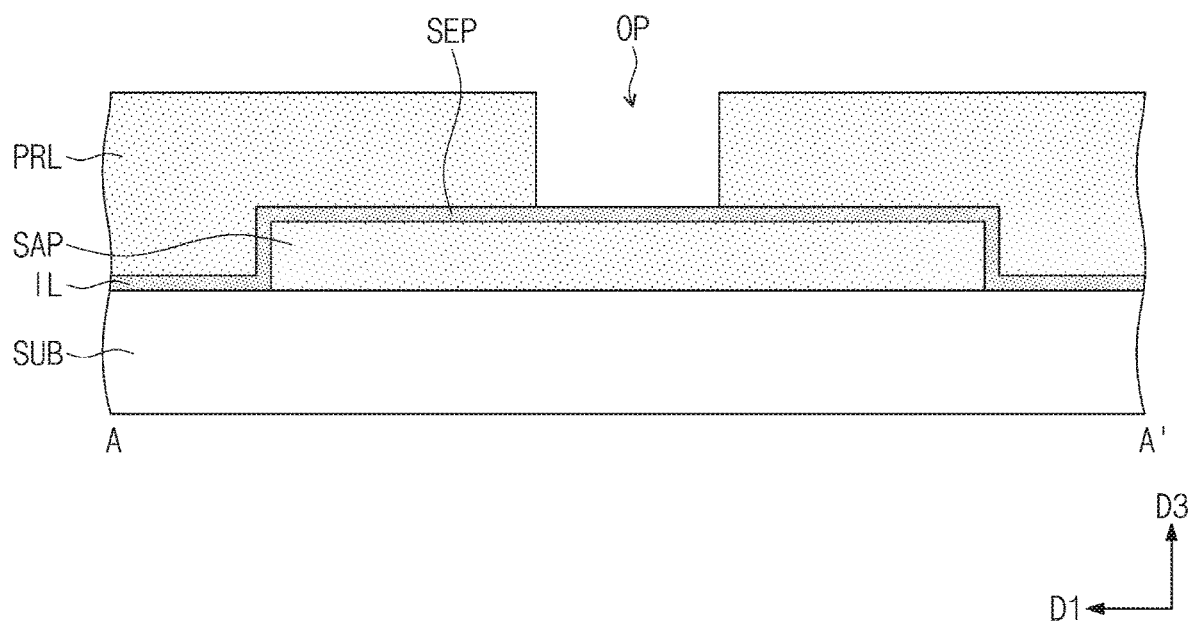

Referring to FIGS. 10 and 11, a photoresist layer PRL may be formed on the inorganic layer IL. The photoresist layer PRL may be formed to fully cover the seed patterns SEP. Thereafter, exposing and developing processes may be performed on the photoresist layer PRL to form openings OP in the photoresist layer PRL. The openings OP may be formed to be overlapped with center regions of the seed patterns SEP, respectively. That is, the openings OP may be formed to expose the center regions of the seed patterns SEP, respectively.

Figure 12:
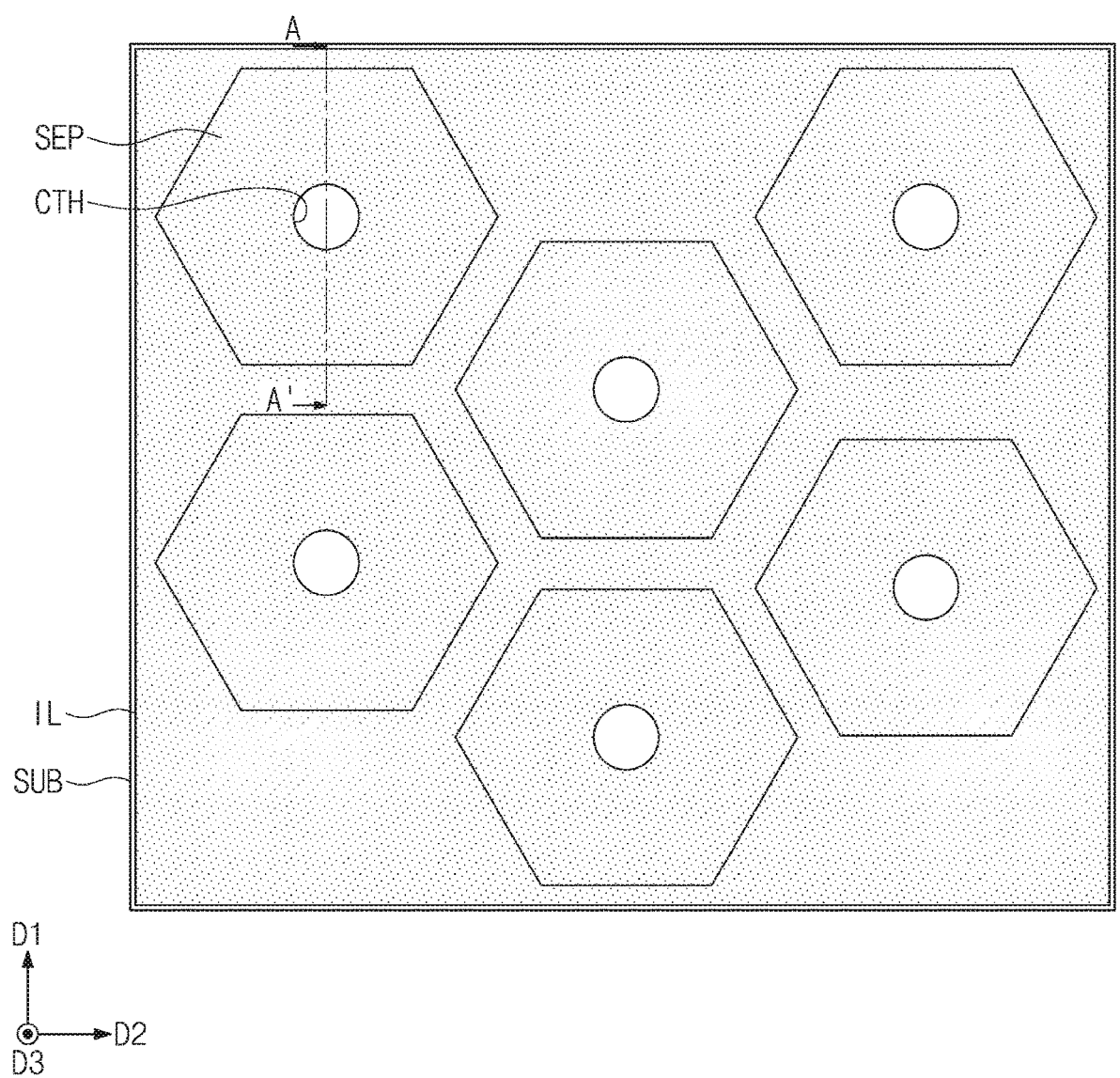
Figure 13:
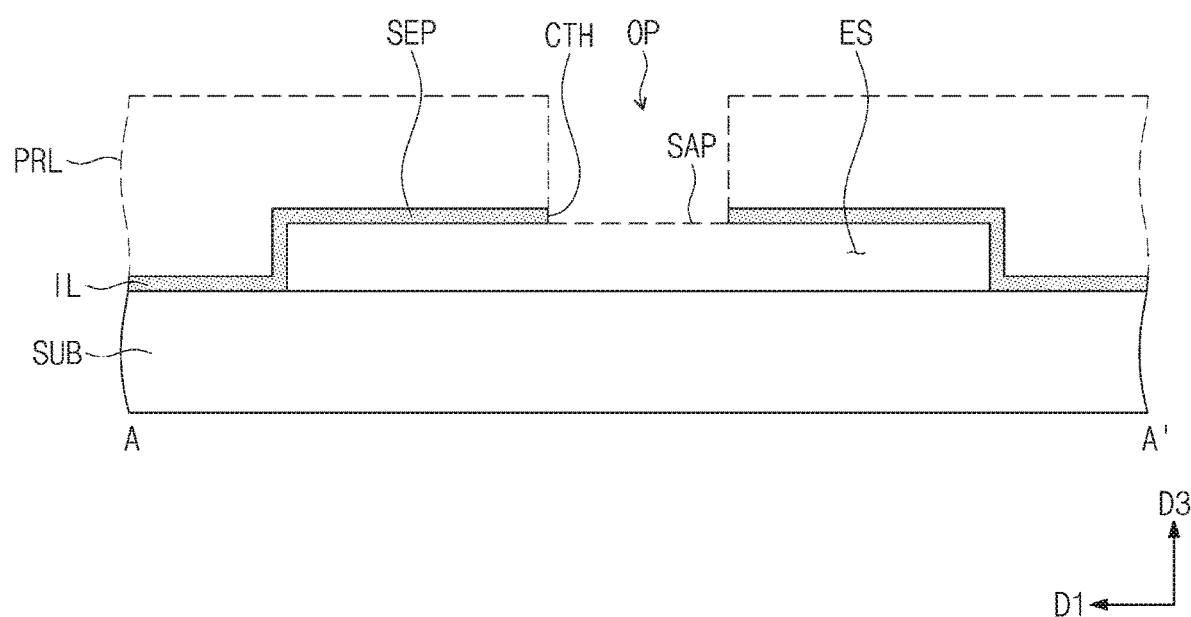

Referring to FIGS. 12 and 13, the exposed portions of the seed patterns SEP may be selectively etched using the photoresist layer PRL as an etch mask. Accordingly, the sacrificial patterns SAP may be exposed through the openings OP. Meanwhile, as a result of the etching process, the contact hole CTH may be formed in the center region of each of the seed patterns SEP. The contact holes CTH may be vertically overlapped with the openings OP, respectively.

The photoresist layer PRL and the exposed sacrificial patterns SAP may be selectively removed. For example, the photoresist layer PRL and the sacrificial patterns SAP may be removed in a thermolysis manner by a thermal treatment process. Thus, only the inorganic layer IL including the seed patterns SEP may be left on the substrate SUB. An empty space ES may be defined between the seed pattern SEP and the substrate SUB.

Figure 14:
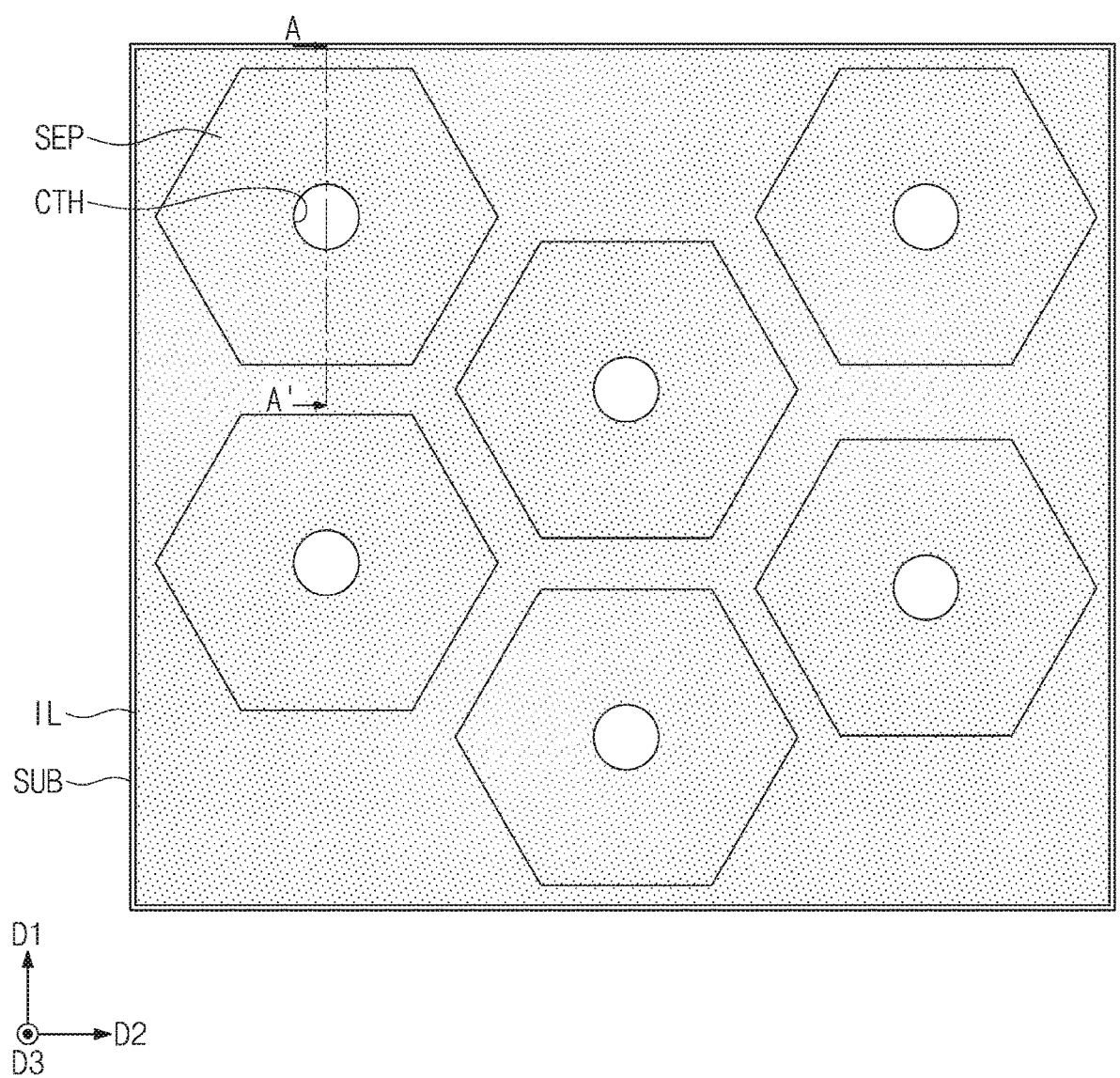
Figure 15:
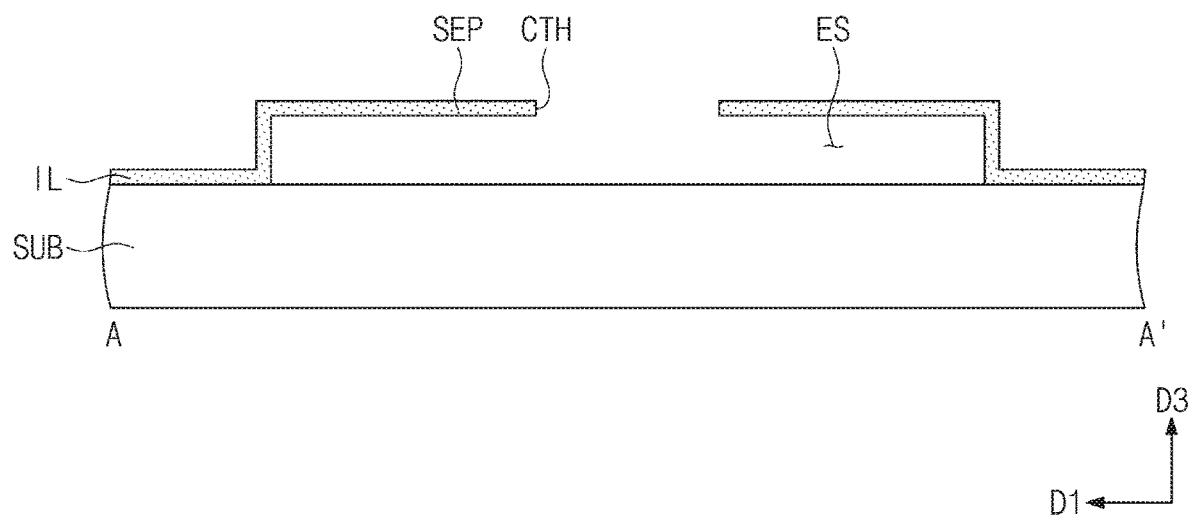

Referring to FIGS. 14 and 15, a first thermal treatment process may be performed on the inorganic layer IL to crystallize the seed patterns SEP. In an embodiment, the first thermal treatment process may be performed at a temperature of 750° C. to 900° C. The first thermal treatment process may be performed at a temperature, where an amorphous alumina layer can be transformed to a polycrystalline γ-phase. The first thermal treatment process may be performed until all of the seed patterns SEP have the polycrystalline γ-phase.

Figure 16:
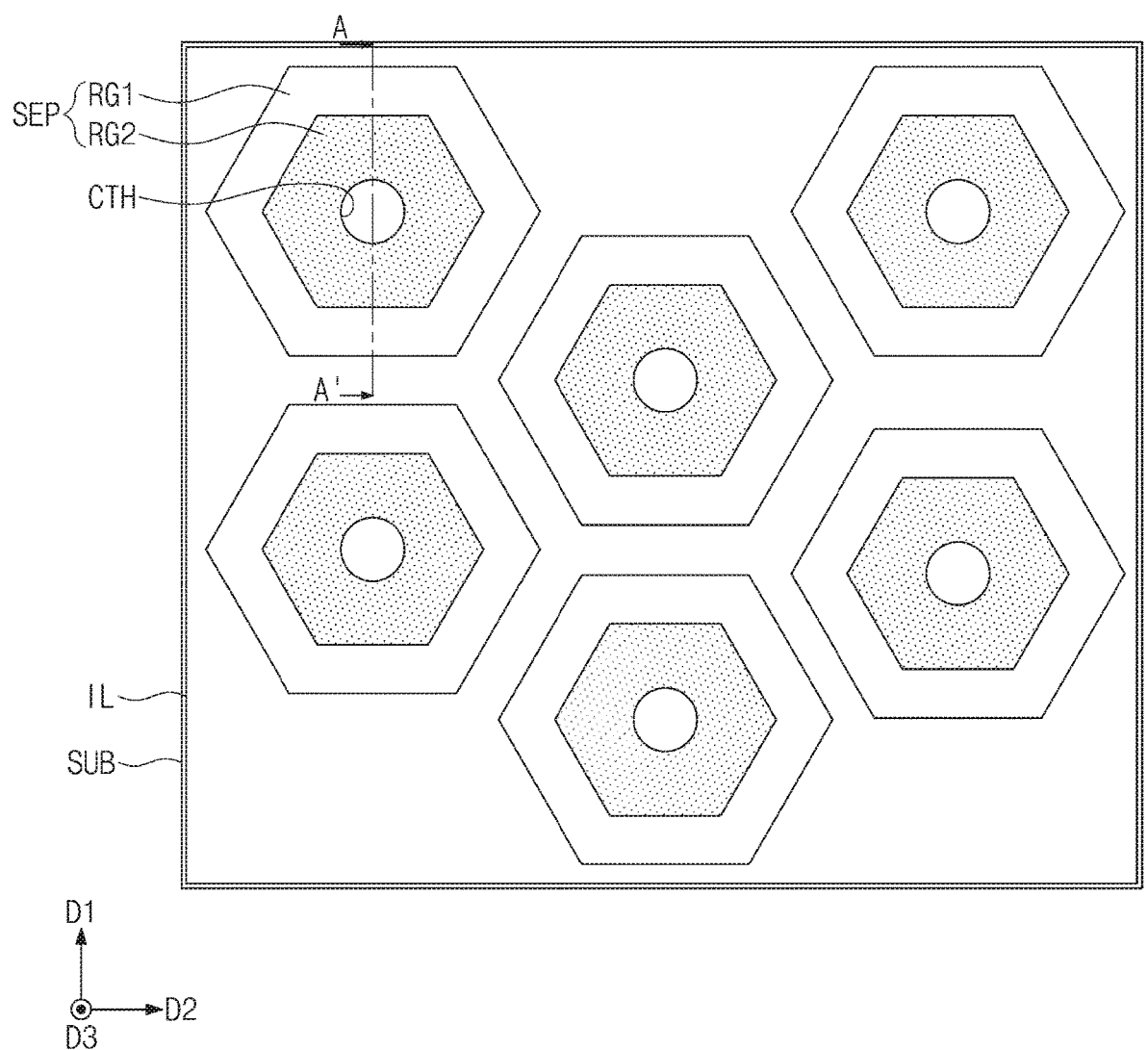
Figure 17:
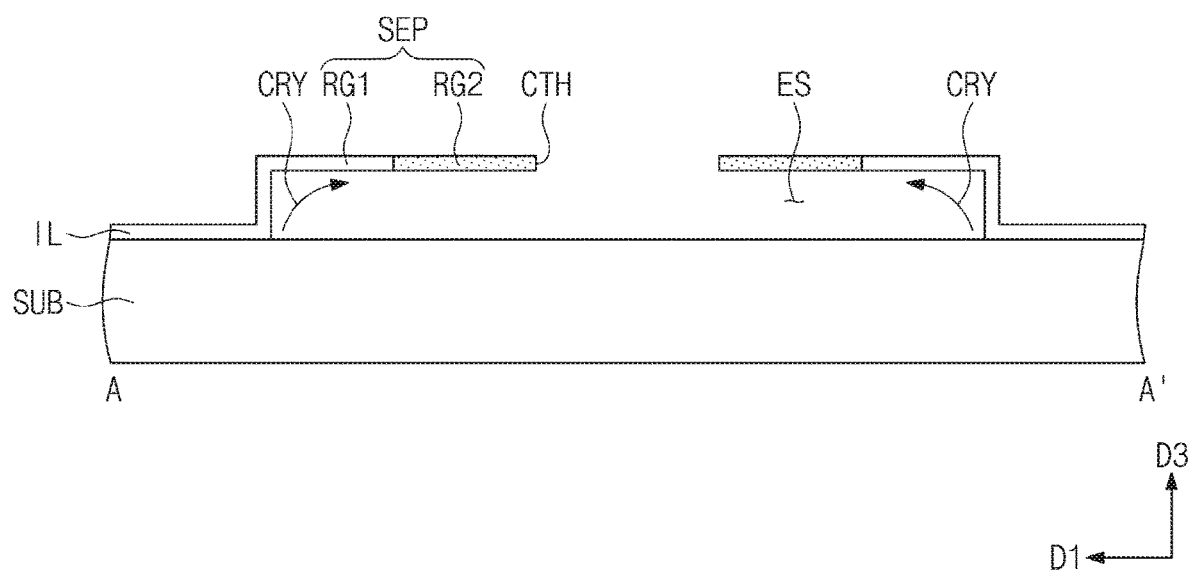

Referring to FIGS. 16 and 17, a second thermal treatment process may be performed on the inorganic layer IL to crystallize at least a portion of the seed pattern SEP to a single crystalline phase. For example, the second thermal treatment process may be performed at a temperature of 1100° C. to 1200° C. At this temperature, the inorganic layer IL may be crystallized to a single crystalline α-phase, due to a crystal structure of the substrate SUB (e.g., a sapphire substrate).

In the second thermal treatment process, the crystallization may make progress from the inorganic layer IL, which is adjacent to the substrate SUB, toward the seed pattern SEP, which is apart from the substrate SUB. That is, the crystallization in the second thermal treatment process may progress toward the center region of the seed pattern SEP in a crystallization direction CRY shown in FIG. 17.

The second thermal treatment process may be terminated if the first region RG1, which is an edge region of the seed pattern SEP, is crystallized to have a single crystalline structure. That is, as a result of the second thermal treatment process, the first region RG1 of a single crystalline α-phase and the second region RG2 of a polycrystalline γ-phase may be formed in the seed pattern SEP. The second region RG2 may be the center region of the seed pattern SEP and may be a region whose crystalline structure is not changed to a single crystalline structure during the second thermal treatment process. The second region RG2 may be adjacent to the contact hole CTH.

According to an embodiment of the inventive concept, the seed pattern SEP may include two regions having different crystalline structures from each other, as a result of the afore-described partial single-crystallization. The seed pattern SEP may be used as a seed pattern to grow the light emitting device ED, which will be described below, on the first and second regions RG1 and RG2.

Figure 18:
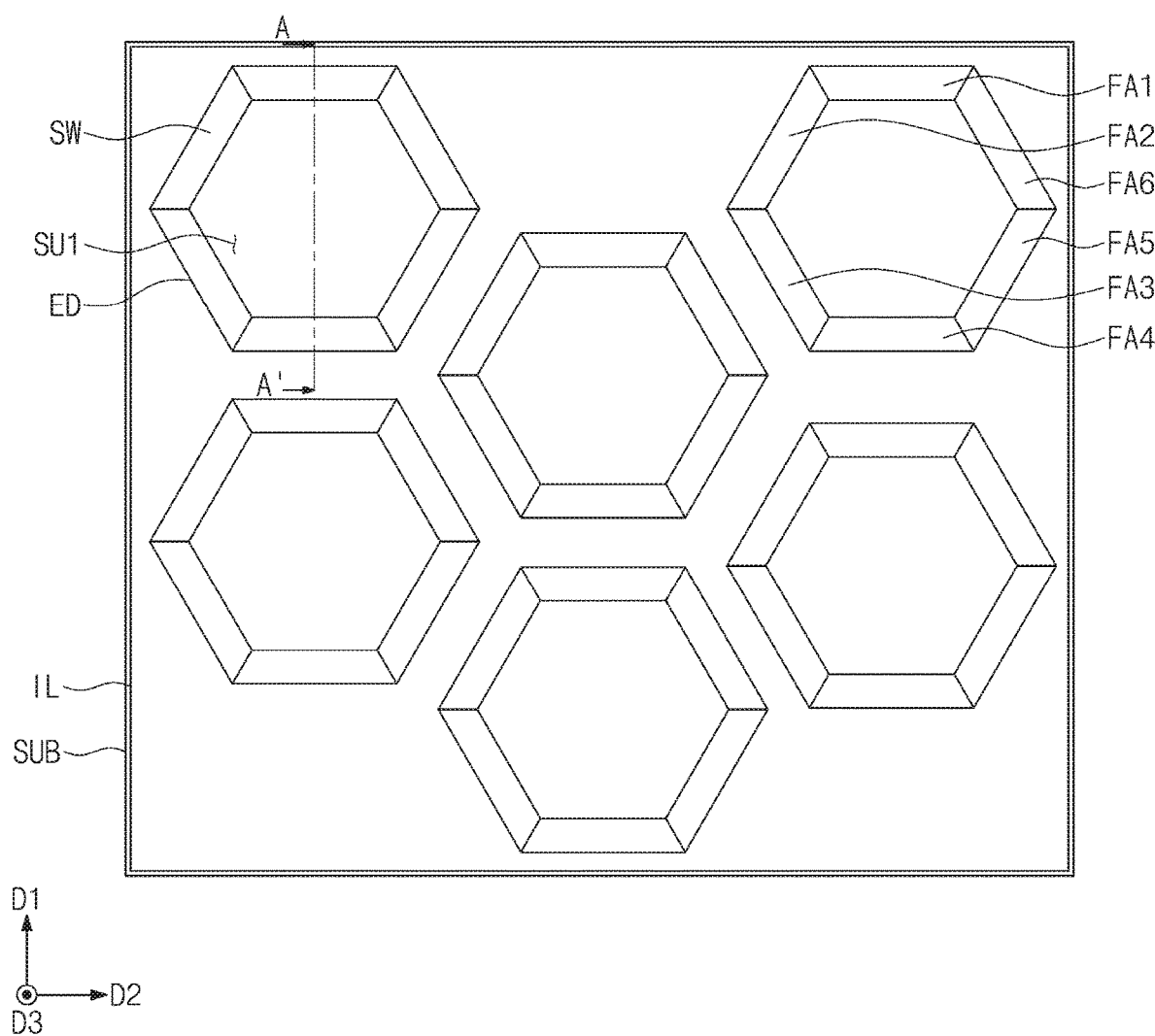
Figure 19:
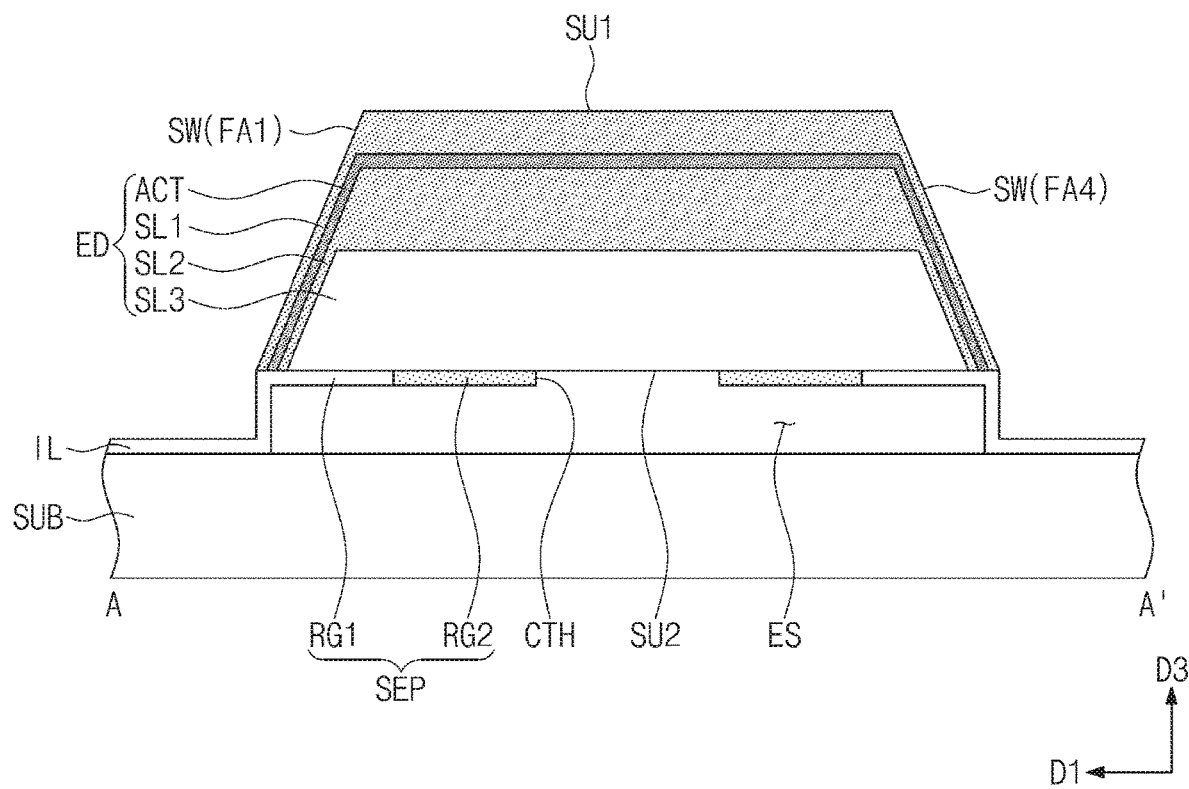

Referring to FIGS. 18 and 19, the light emitting devices ED may be formed on the seed patterns SEP, respectively. A plurality of light emitting devices ED may be two-dimensionally formed to correspond to the seed patterns SEP, which are two-dimensionally arranged.

In the present embodiment, the light emitting device ED may be grown to have the same planar shape as the seed pattern SEP. In other words, each of the light emitting devices ED may have a hexagonal shape. In this case, the light emitting devices ED may be arranged to form a honeycomb shape.

The formation of the light emitting device ED may include performing a metal organic chemical vapor deposition (MOCVD) process. For example, a MOCVD process, in which a top surface of the seed pattern SEP is used as a seed, may be performed to grow the light emitting device ED on the seed pattern SEP. The light emitting device ED may be formed of or include at least one of III-V compound semiconductor materials (e.g., GaN, AlN, AlGaN, InGaN, InN, InAlGaN, AlInN, or combinations thereof).

The light emitting device ED of a multi-layered structure may be formed by adjusting a source gas, a process temperature, and a chamber pressure in the MOCVD process. For example, the formation of the light emitting device ED may include forming a third semiconductor layer SL3 on the seed pattern SEP, forming a second semiconductor layer SL2 on the third semiconductor layer SL3, forming an active layer ACT on the second semiconductor layer SL2, and forming a first semiconductor layer SL1 on the active layer ACT.

In detail, the third semiconductor layer SL3 may be formed to include a GaN layer. The second semiconductor layer SL2 may be formed to include a GaN layer doped with impurities (e.g., silicon (Si), germanium (Ge), tin (Sn), selenium (Se), or tellurium (Te)). The active layer ACT may be formed to have a multiple quantum well structure including an InGaN layer and a GaN layer. The first semiconductor layer SL1 may be formed to include a GaN layer doped with impurities (e.g., magnesium (Mg), zinc (Zn), calcium (Ca), strontium (Sr), or barium (Ba)). The active layer ACT and the first to third semiconductor layers SL1, SL2, and SL3 may be successively formed in a single deposition chamber.

The light emitting device ED may have a second surface SU2, which is in contact with the seed pattern SEP, a first surface SU1, which is opposite to the second surface SU2 in the third direction D3, and a sidewall SW, which is slantingly extended from the second surface SU2 to the first surface SU1. The sidewall SW may include the first to sixth facets FA1-FA6. Each of the first to sixth facets FA1-FA6 may be a non-etching surface, which is formed by an epitaxial growth process, not by an etching process.

In a comparative example, the light emitting device may be formed by patterning a GaN layer, which is formed by an epitaxial growth process, using a plasma etching method. In this case, the sidewall of the light emitting device may be an etching surface, which is formed by the etching method, and may be different from a crystal facet in the afore-described embodiment. For example, in the case where the sidewall of the light emitting device is formed by a plasma etching method, defects, such as non-radiative recombination, may occur on the resultant etched surface. Such defects may lead to deterioration in performance (e.g., external quantum efficiency (EQE)) of the light emitting device. The deterioration of the EQE characteristic may become more and more problematic as a size of the light emitting device decreases. Furthermore, in the case where the sidewall of the light emitting device is the etched surface, a problem of leakage current may occur in the light emitting device.

According to an embodiment of the inventive concept, the sidewall SW of the light emitting device ED may be formed by an epitaxial growth process, not by a plasma etching process. This means that each of the first to sixth facets FA1-FA6 of the sidewall SW is a substantially perfect crystal facet which is not damaged by plasma. Thus, in the light emitting device ED according to the present embodiment, it may be possible to realized improved performance and to prevent the problem of leakage current.

Figure 20:
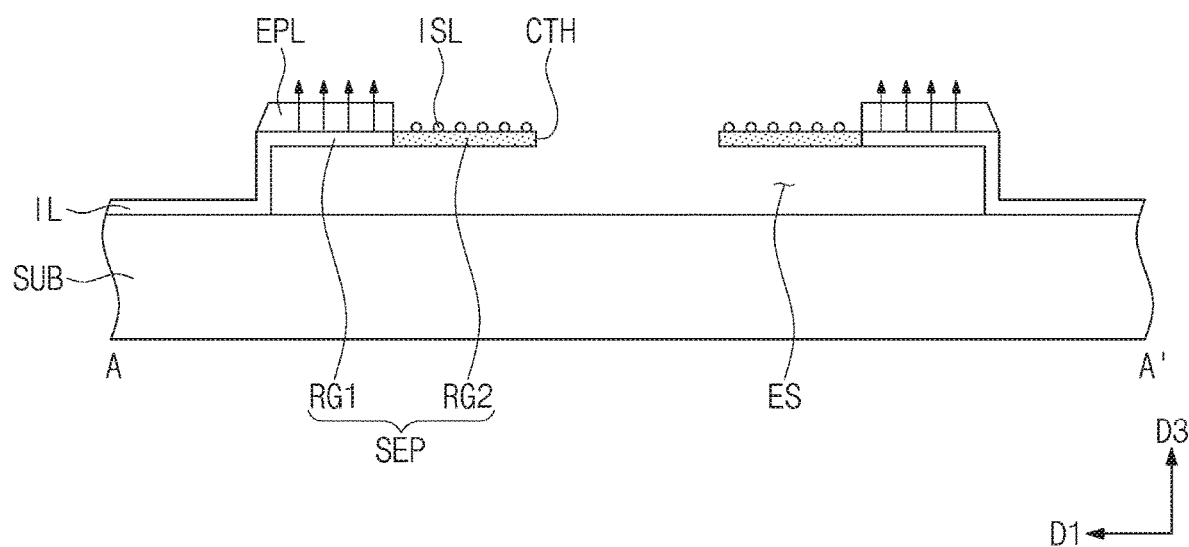
FIGS. 20, 21, and 22 are sectional views sequentially illustrating steps of growing a light emitting device (i.e., an epitaxial layer) on a sacrificial pattern through a metal organic chemical vapor deposition process according to an embodiment of the inventive concept.
Figure 21:
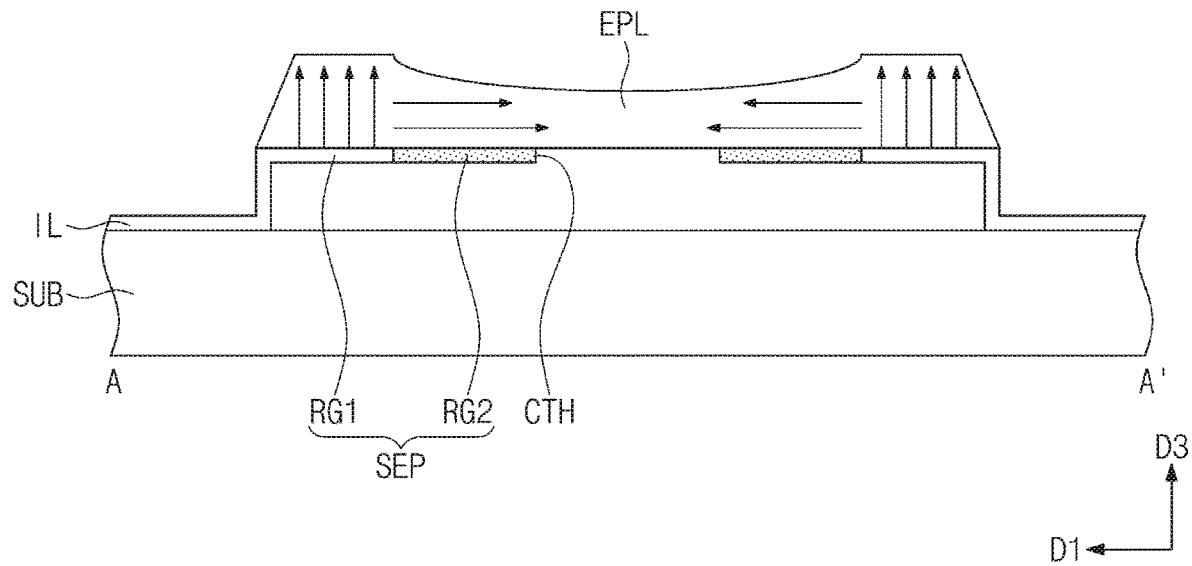
Figure 22:
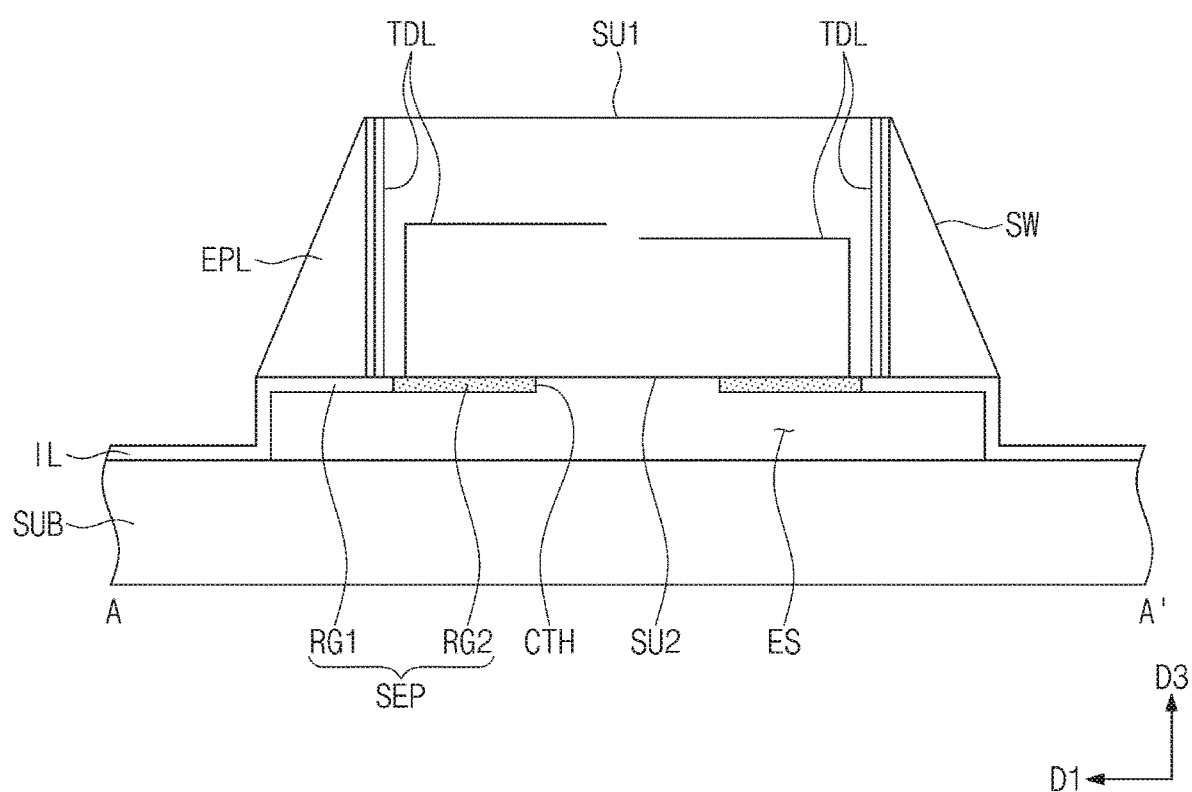

FIGS. 20, 21, and 22 are sectional views sequentially illustrating steps of growing the light emitting device ED (e.g., an epitaxial layer EPL) on the sacrificial pattern SAP through a metal organic chemical vapor deposition process according to an embodiment of the inventive concept.

Referring to FIG. 20, the epitaxial layer EPL may be grown on the sacrificial pattern SAP through the metal organic chemical vapor deposition. As described above, the sacrificial pattern SAP may include the first region RG1 having the single crystalline α-phase and the second region RG2 having the polycrystalline γ-phase. A growth rate of the epitaxial layer EPL on the first region RG1 may be different from a growth rate of the epitaxial layer EPL on the second region RG2.

In detail, the epitaxial growth of the epitaxial layer EPL may be faster on the first region RG1 than on the second region RG2. For example, on the first region RG1, the epitaxial layer EPL may be grown in the form of a layer, whereas on the second region RG2, grains ISL (e.g., of GaN) may be grown in the form of island. On the first region RG1, the epitaxial layer EPL may be rapidly grown in a [0001] direction (e.g., the third direction D3).

Referring to FIG. 21, if the metal organic chemical vapor deposition process continues, the epitaxial layer EPL on the first region RG1 may be horizontally grown toward the second region RG2. For example, the epitaxial layer EPL on the first region RG1 may be grown not only in the third direction D3 but also in the first direction D1. Accordingly, the second region RG2 may be covered with the epitaxial layer EPL. Furthermore, the horizontal growth of the epitaxial layer EPL may be performed such that a portion of the epitaxial layer EPL is formed on the contact hole CTH, and in this case, the epitaxial layer EPL may be formed on the entire region of the seed pattern SEP.

FIG. 22 illustrates a final structure of the epitaxial layer EPL, which is formed when the metal organic chemical vapor deposition process is finished. The epitaxial layer EPL may have the second surface SU2, which is in contact with the seed pattern SEP, and the first surface SU1, which is opposite to the second surface SU2 in the third direction D3.

The epitaxial layer EPL may include the threading dislocations TDL, which are extended from the second surface SU2 to the first surface SU1 in the third direction D3. The threading dislocations TDL may be crystal defects which are formed during the growth of the epitaxial layer EPL. Since the epitaxial layer EPL on the first region RG1 is chiefly grown in the third direction D3 as described above, most of the threading dislocations TDL may be formed on the first region RG1.

Meanwhile, the epitaxial layer EPL on the second region RG2 may result from the horizontal growth in the first direction D1, not in the third direction D3. Thus, crystal defects (i.e., the threading dislocations TDL) on the second region RG2 may not be continually formed from the second surface SU2 to the first surface SU1. As a result, the epitaxial layer EPL on the second region RG2 may have a relatively low density of the threading dislocations TDL. In this case, it may be possible to lower an overall threading dislocation density of the light emitting device ED and thereby to improve the light-emitting efficiency of the light emitting device ED.

Figure 23:
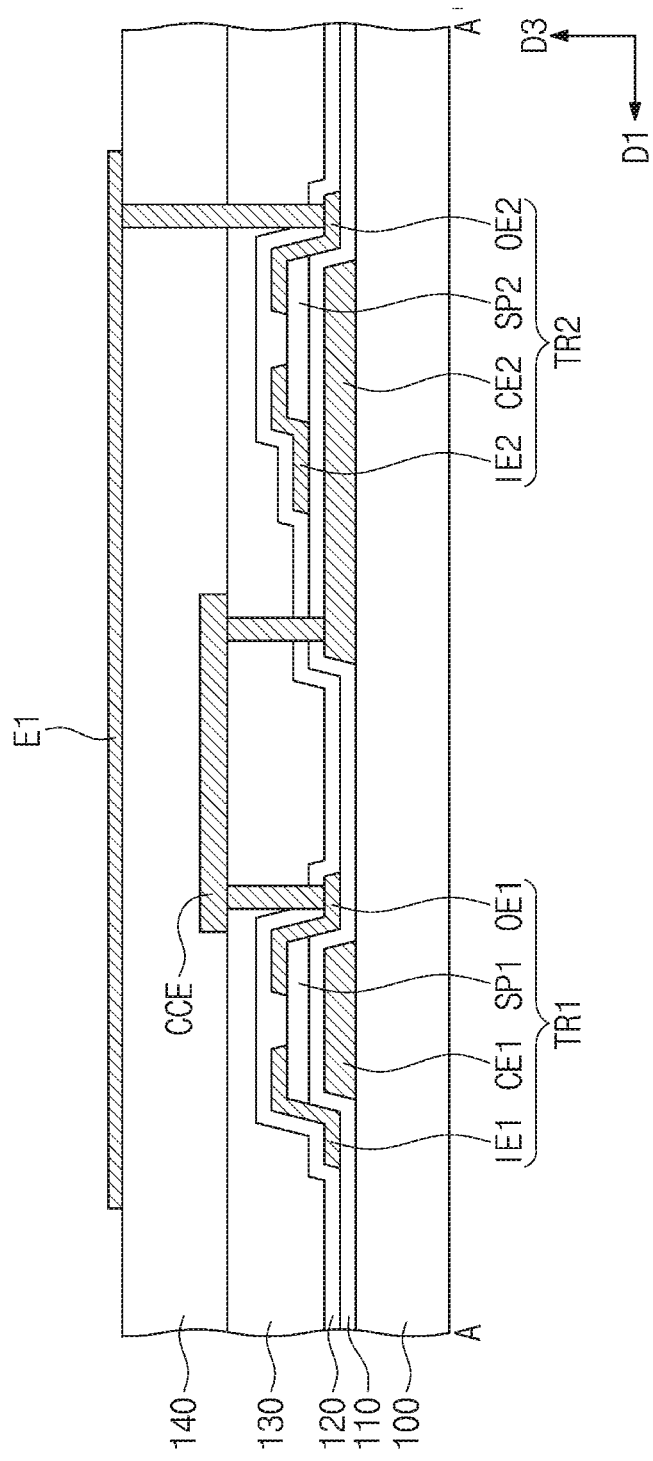
FIGS. 23, 24, and 25 are sectional views illustrating a method of manufacturing a display device, according to an embodiment of the inventive concept.
Figure 24:
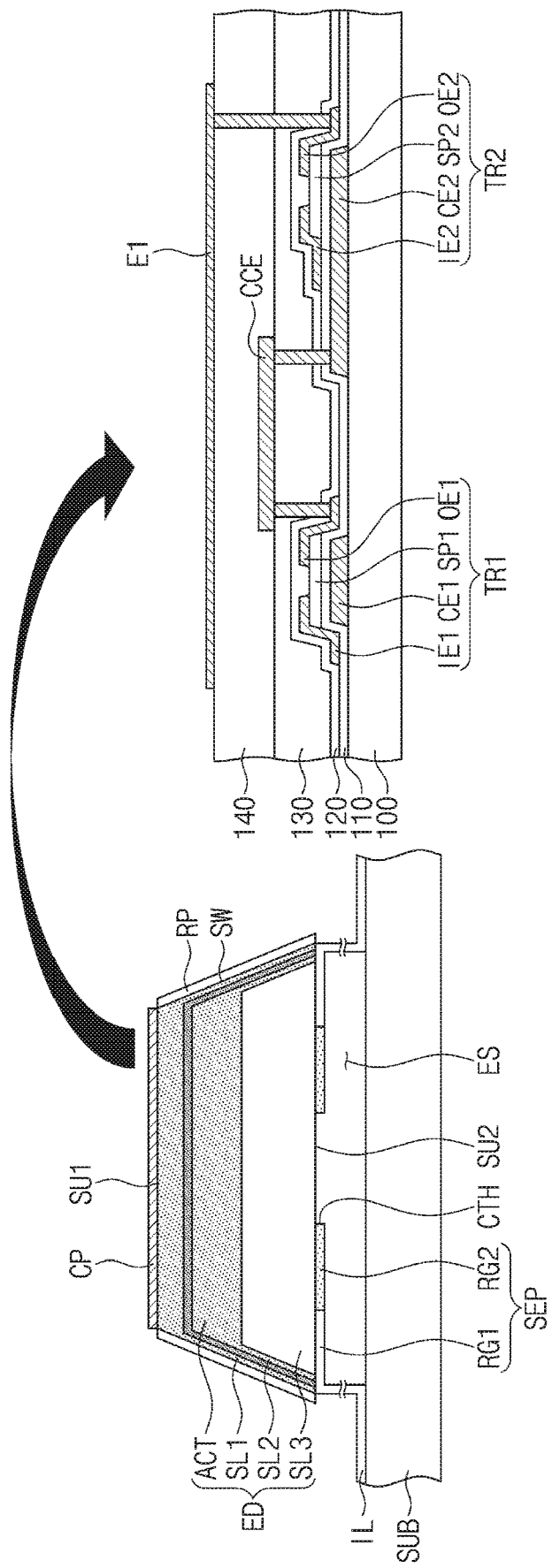
Figure 25:
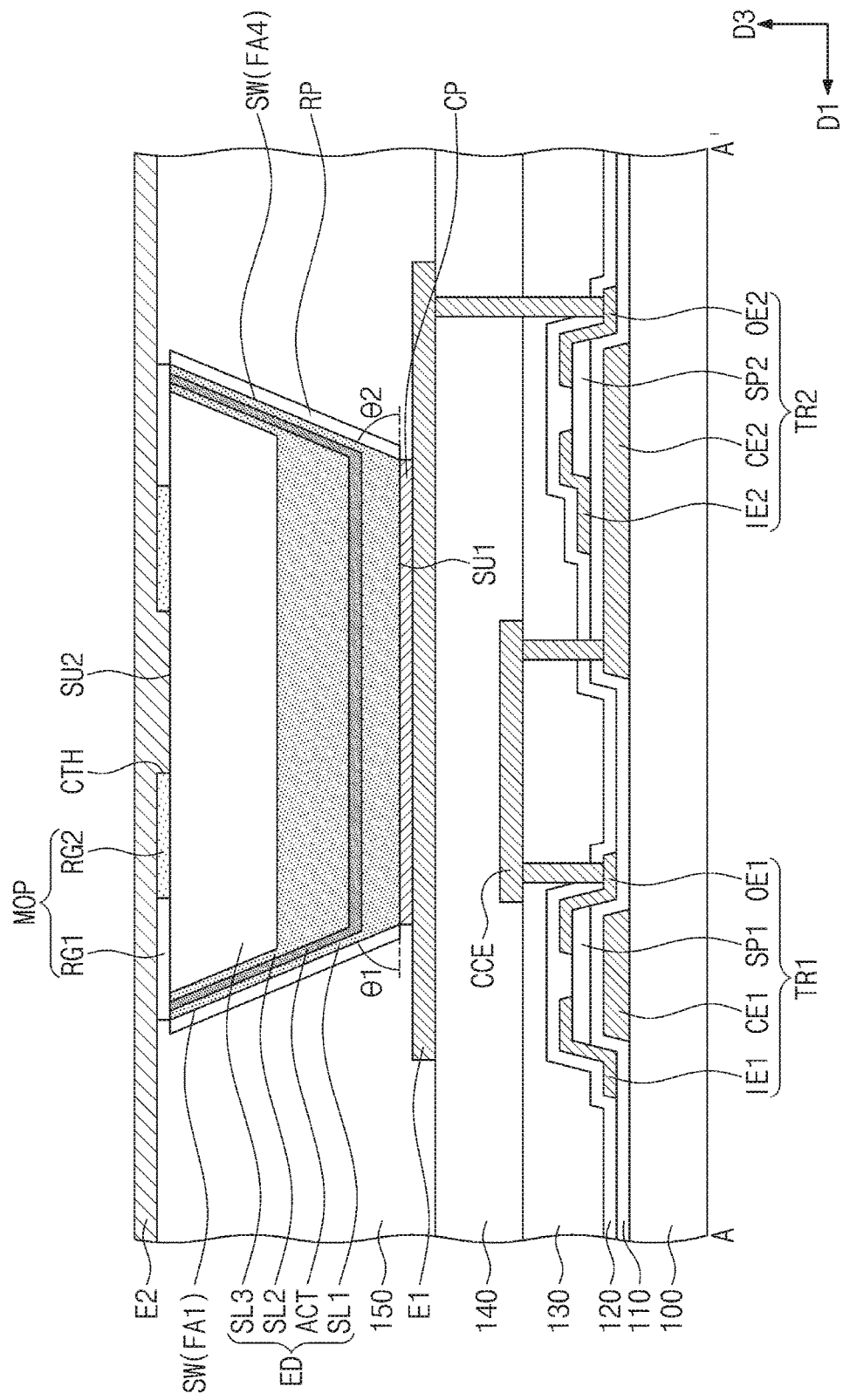

FIGS. 23, 24, and 25 are sectional views illustrating a method of manufacturing a display device, according to an embodiment of the inventive concept.

Referring to FIG. 23, first and second thin-film transistors TR1 and TR2 may be formed on a base layer 100. The formation of the first and second thin-film transistors TR1 and TR2 may include performing a LTPS process or a LTPO process. A connection electrode CCE may be formed to electrically connect the first and second thin-film transistors TR1 and TR2 to each other. A first electrode E1 may be formed on the connection electrode CCE. The first electrode E1 may be electrically connected to the second thin-film transistor TR2. The first electrode E1 may be exposed to the outside.

Referring to FIG. 24, a reflection pattern RP and a connection pattern CP may be formed on the light emitting device ED described with reference to FIGS. 18 and 19. The reflection pattern RP may be formed to selectively cover only the sidewall SW of the light emitting device ED. The connection pattern CP may be formed to selectively cover only the first surface SU1 of the light emitting device ED.

The light emitting device ED may be separated from the substrate SUB. The separation of the light emitting device ED may be achieved by a mechanical lift-off method. In an embodiment, during the mechanical lift-off process, the seed pattern SEP on the second surface SU2 of the light emitting device ED may be maintained as they are, thereby forming a metal oxide pattern MOP covering the second surface SU2.

The separated light emitting device ED may be mounted on the first electrode E1. The separated light emitting device ED may be inverted and then may be disposed in such a way that the connection pattern CP thereof is placed on the first electrode E1.

Referring to FIG. 25, the fifth insulating layer 150 may be formed to cover the first electrode E1 and the light emitting device ED. A second electrode E2 may be formed on the fifth insulating layer 150. The second electrode E2 may be connected to the third semiconductor layer SL3 of the light emitting device ED through the contact hole CTH of the metal oxide pattern MOP.

Referring back to FIGS. 3 and 4, a light-blocking pattern BM and a color filter CF may be formed on the second electrode E2. The light-blocking pattern BM may be a black matrix. The color filter CF may include at least one of a red color filter, a green color filter, or a blue color filter. A cover layer CV may be formed on the light-blocking pattern BM and the color filter CF.

In a method of manufacturing a display device according to an embodiment of the inventive concept, the light emitting device ED and the substrate SUB may be easily separated from each other by the mechanical lift-off method. Even when the light emitting device ED is separated from the substrate SUB, the metal oxide pattern MOP may still be attached to or left on the second surface SU2. In other words, the metal oxide pattern MOP may not be removed, and the light emitting device ED with the metal oxide pattern MOP may be directly used as a part of a display device. Thus, it may be unnecessary to perform an additional process of removing the metal oxide pattern MOP, and this may make it possible to reduce fabrication cost of the light emitting device ED. Such a metal oxide pattern MOP may be used to passivate the second surface SU2 of the light emitting device ED and may also provide a n-type contact through the contact hole CTH.

Figure 26:
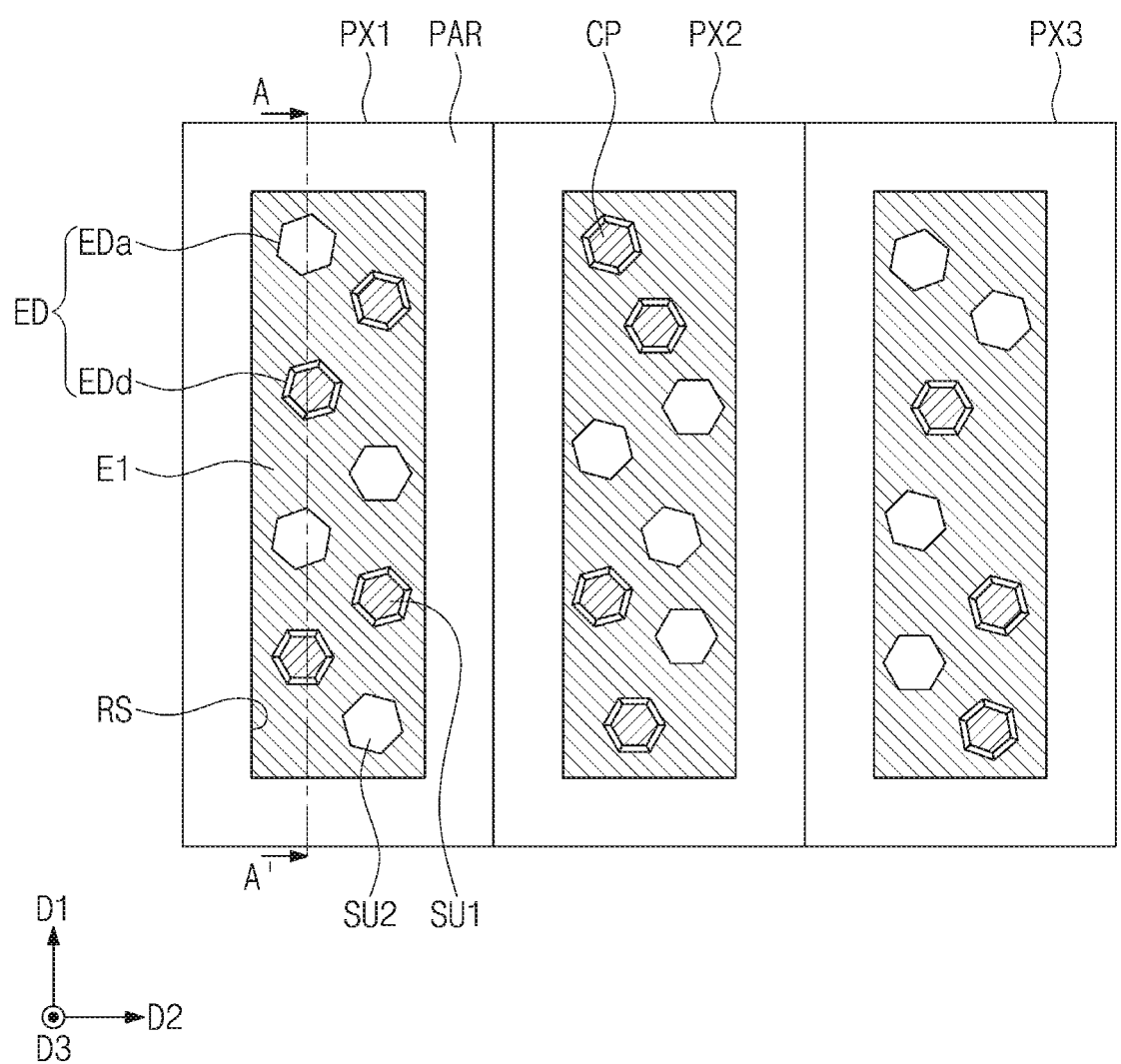
FIG. 26 is a plan view illustrating a display panel of a display device according to an embodiment of the inventive concept.
Figure 27:
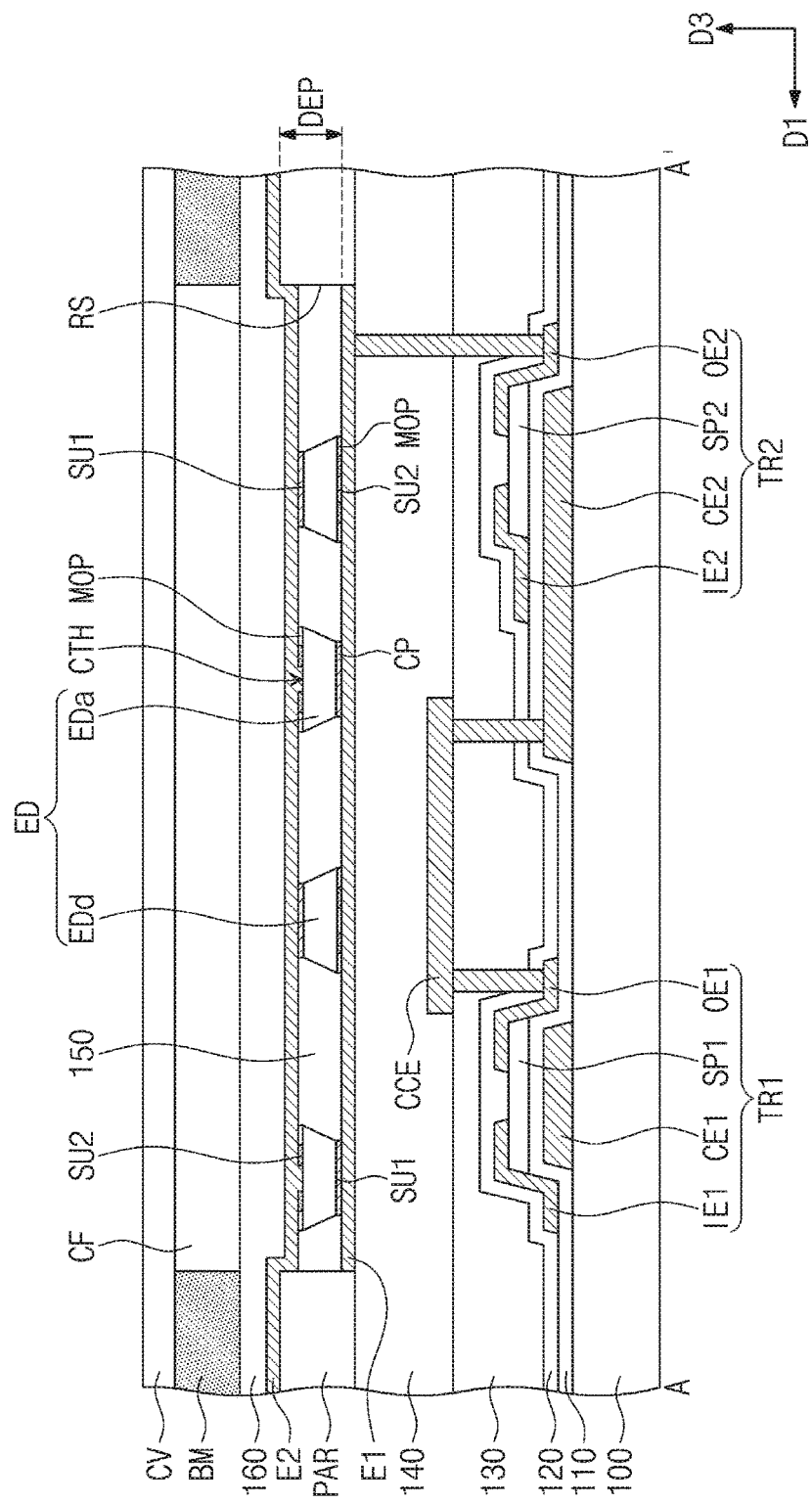
FIG. 27 is a sectional view taken along a line A-A' of FIG. 26.
Figure 28:
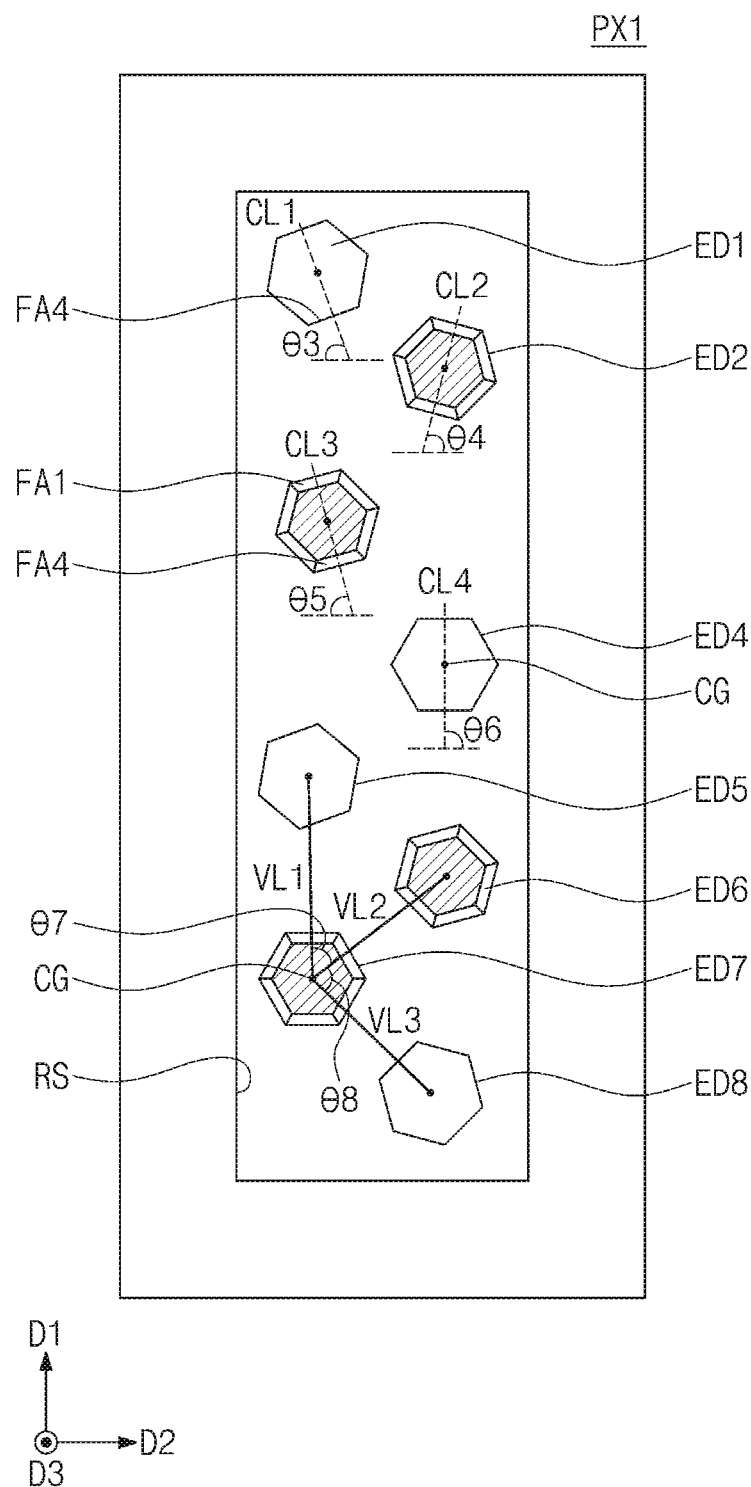
FIG. 28 is an enlarged plan view of a first pixel of FIG. 26.

FIG. 26 is a plan view illustrating a display panel of a display device according to an embodiment of the inventive concept. FIG. 27 is a sectional view taken along a line A-A' of FIG. 26. FIG. 28 is an enlarged plan view of a first pixel of FIG. 26. In the following description of the display device according to the present embodiment, an element previously described with reference to FIGS. 3, 4, 5A, and 5B may be identified by the same reference number without repeating an overlapping description thereof.

Referring to FIGS. 26 and 27, first to third pixels PX1 to PX3 may be provided on a base layer 100. The base layer 100 may include a silicon substrate, a plastic substrate, a glass substrate, an insulating film, or a stack including a plurality of insulating layers.

The first to third pixels PX1 to PX3 may be two-dimensionally arranged. As an example, the first to third pixels PX1 to PX3 may be arranged in a second direction D2. Although not shown, additional pixels may be further provided on the base layer 100 to form two-dimensional pixel arrangement.

Each of the first to third pixels PX1 to PX3 may include a first thin-film transistor TR1, a second thin-film transistor TR2, and a plurality of light emitting devices ED. Hereinafter, one (e.g., the first pixel PX1) of the first to third pixels PX1 to PX3 will be exemplarily described.

The first and second thin-film transistors TR1 and TR2 may be disposed on the base layer 100. The first and second thin-film transistors TR1 and TR2 may be configured to have substantially the same features as those described with reference to FIGS. 3 and 4.

A partition wall structure PAR may be provided on a fourth insulating layer 140. The partition wall structure PAR may have a bottom surface that is coplanar with a bottom surface of a first electrode E1. The partition wall structure PAR may define a recess region RS exposing the top surface of the first electrode E1. For example, the recess region RS may be defined by an inner sidewall of the partition wall structure PAR and the top surface of the first electrode E1. The recess region RS may be provided to have a specific depth DEP, when measured from a top surface of the partition wall structure PAR.

The plurality of light emitting devices ED may be provided on the first electrode E1 in the recess region RS. Each of the light emitting devices ED may be configured to have substantially the same features as that described with reference to FIGS. 3, 4, 5A, and 5B.

The light emitting devices ED may include active light emitting devices EDa and dummy light emitting devices EDd. Each of the active light emitting devices EDa may be disposed in such a way that a first surface SU1 thereof faces the first electrode E1 or the base layer 100. A connection pattern CP may be interposed between the active light emitting device EDa and the first electrode E1. The first surface SU1 of the active light emitting device EDa may be electrically connected to the first electrode E1 through the connection pattern CP. Each of the dummy light emitting devices EDd may be disposed in such a way that a second surface SU2 thereof faces the first electrode E1 or the base layer 100. The second surface SU2 of the dummy light emitting device EDd may be spaced apart from the first electrode E1 by the metal oxide pattern MOP.

A ratio of the number of the active light emitting devices EDa to the total number of the light emitting devices ED may range from about 40% to about 60%. A ratio of the number of the dummy light emitting devices EDd to the total number of the light emitting devices ED may range from about 60% to about 40%. The number of the active light emitting devices EDa may be substantially equal to the number of the dummy light emitting devices EDd, but in an embodiment, they may be different from each other.

In an embodiment, a ratio of the number of the active light emitting devices EDa to the total number of the light emitting devices ED may range from about 60% to about 100%. In other words, the number of the active light emitting devices EDa may be greater than the number of the dummy light emitting devices EDd.

A fifth insulating layer 150 may be provided on the fourth insulating layer 140 to fill a region between the light emitting devices ED. A second electrode E2 may be provided on the fifth insulating layer 150 and the light emitting devices ED. The metal oxide pattern MOP covering the second surface SU2 of the active light emitting device EDa may have a contact hole CTH exposing a center region of the second surface SU2. The second electrode E2 may be in contact with the second surface SU2 of the active light emitting device EDa.

According to an embodiment of the inventive concept, the first electrode E1 may be a p-type electrode, and the second electrode E2 may be an n-type electrode. In the active light emitting device EDa, the p-type or first electrode E1 may be electrically connected to a p-type semiconductor layer adjacent to the first surface SU1 through the connection pattern CP, and the n-type or second electrode E2 may be electrically connected to an n-type semiconductor layer adjacent to the second surface SU2. Thus, the active light emitting device EDa may be used to emit light during an operation of the display device.

By contrast, for the dummy light emitting device EDd, the metal oxide pattern MOP may prevent the first electrode E1 from being in contact with the second surface SU2, while the n-type or second electrode E2 is connected to a p-type semiconductor layer adjacent to the first surface SU1. Thus, the dummy light emitting device EDd may not emit any light, during the operation of the display device. Since the active light emitting devices EDa accounts for about 40% to 60% of the light emitting devices ED, each of the pixels PX1 to PX3 may be used as a normal pixel.

A sixth insulating layer 160 may be provided on the second electrode E2. The sixth insulating layer 160 may have a flat top surface. A light-blocking pattern BM and a color filter CF may be provided on the sixth insulating layer 160. The light-blocking pattern BM may have an opening, which is vertically overlapped with the recess region RS, and the color filter CF may be provided in the opening. A cover layer CV may be provided on the light-blocking pattern BM and the color filter CF.

The light emitting devices ED, which are randomly arranged in the recess region RS of the first pixel PX1, will be described in more detail with reference to FIG. 28 again. The light emitting devices ED of the first pixel PX1 may include first to eighth light emitting devices ED1 to ED8. Each of the first to eighth light emitting devices ED1 to ED8 may have a center CG. As an example, the center CG of the light emitting device ED may be a center of gravity of the light emitting device ED.

A first center line CL1 may be defined to pass through the center CG of the first light emitting device ED1. When viewed in a plan view, the first center line CL1 may be perpendicular to the first and fourth facets FA1 and FA4 of the first light emitting device ED1. Second to fourth center lines CL2 to CL4 of the second to fourth light emitting devices ED2 to ED4 may be defined in the same manner as the first center line CL1 of the first light emitting device ED1.

The first to fourth center lines CL1 to CL4 may not be parallel to each other. In other words, since the light emitting devices ED are randomly arranged, the first to fourth center lines CL1 to CL4 may not be parallel to each other. The first to fourth center lines CL1 to CL4 may cross each other. As an example, the first center line CL1 may be inclined at a third angle θ3 to the second direction D2, the second center line CL2 may be inclined at a fourth angle θ4 to the second direction D2, the third center line CL3 may be inclined at a fifth angle θ5 to the second direction D2, and the fourth center line CL4 may be inclined at a sixth angle θ6 to the second direction D2. The third to sixth angles θ3 to θ6 may be different from each other.

The fifth light emitting device ED5, the sixth light emitting device ED6, and the eighth light emitting device ED8 may be provided adjacent to the seventh light emitting device ED7. A first virtual line VL1 may be defined as a line connecting the center CG of the seventh light emitting device ED7 to the center CG of the fifth light emitting device ED5, a second virtual line VL2 may be defined as a line connecting the center CG of the seventh light emitting device ED7 to the center CG of the sixth light emitting device ED6, and a third virtual line VL3 may be defined as a line connecting the center CG of the seventh light emitting device ED7 to the center CG of the eighth light emitting device ED8.

The first virtual line VL1, the second virtual line VL2, and the third virtual line VL3 may have different lengths from each other. In other words, distances from the fifth light emitting device ED5, the sixth light emitting device ED6, and the eighth light emitting device ED8 to the seventh light emitting device ED7 may be different from each other. An angle between the first virtual line VL1 and the second virtual line VL2 may be a seventh angle θ7, and an angle between the second virtual line VL2 and the third virtual line VL3 may be an eighth angle θ8. The seventh angle θ7 and the eighth angle θ8 may be different from each other.

The method of manufacturing a display device according to the present embodiment may include randomly scattering micro-LED flakes on the pixels of the display device.

The micro-LED flakes may be prepared by separating the light emitting devices ED on the substrate SUB, which is manufactured by FIGS. 6 to 19, using the mechanical lift-off method and then collecting the separated light emitting devices ED. In other words, each flake in the micro-LED flakes may be the light emitting device ED according to an embodiment of the inventive concept.

Since the micro-LED flakes are randomly scattered on the pixel, the light emitting devices ED on the first electrode E1 may be two-dimensionally and randomly arranged. In an embodiment, each of the light emitting devices ED on the first electrode E1 may be the active light emitting device EDa at a probability of 50% or may be the dummy light emitting device EDd at a probability of 50%.

According to the present embodiment, the display device may be realized by randomly arranging the light emitting devices on the pixel. Since the light emitting devices on the pixel has a large ratio of its largest width to its height, about 50% of the light emitting devices may be used as active light emitting devices. Since the light emitting devices are arranged on the pixel in the randomized manner, not in a regular manner, it may be possible to quickly and economically fabricate a large-area display panel.

According to an embodiment of the inventive concept, a display device may be provided to include a light emitting device with improved light-emitting efficiency. In a method of manufacturing a display device according to an embodiment of the inventive concept, by adjusting a shape of a seed pattern, it may be possible to easily manufacture a light emitting device of a desired shape.

While example embodiments of the inventive concept have been particularly shown and described, it will be understood by one of ordinary skill in the art that variations in form and detail may be made therein without departing from the spirit and scope of the attached claims.

What is claimed is:

1. A display device, comprising:
a plurality of pixels;
a light emitting device provided in each of the plurality of pixels, the light emitting device having a first surface and a second surface, which are opposite to each other;
a first electrode electrically connected to the first surface of the light emitting device;
a second electrode electrically connected to the second surface of the light emitting device; and
a metal oxide pattern interposed between the second surface of the light emitting device and the second electrode,
wherein the metal oxide pattern comprises a first region and a second region,
the first region encloses the second region,
the second region has a contact hole exposing at least a portion of the second surface,
the second electrode is coupled to the second surface through the contact hole, and
the first region and the second region have crystalline phases different from each other.

2. The display device of claim 1, wherein a density of the first region is higher than a density of the second region.

3. The display device of claim 1, wherein a crystallization temperature of the first region is higher than a crystallization temperature of the second region.

4. The display device of claim 1, wherein the first region comprises alumina of single crystalline α-phase, and
the second region comprises alumina of polycrystalline γ-phase.

5. The display device of claim 1, wherein the first surface comprises a third region and a fourth region, which are edge and center regions thereof, and
a density of threading dislocations in the third region is higher than a density of threading dislocations in the fourth region.

6. The display device of claim 1, wherein the light emitting device further comprises a sidewall, which is extended from the first surface to the second surface, and
the sidewall comprises a {n −n 0 k} facet, where each of indices n and k is an integer of 1 or greater.

7. The display device of claim 6, wherein the light emitting device has a hexagonal shape, when viewed in a plan view,
the sidewall comprises first to sixth facets, and
the first to sixth facets are arranged along sides of the light emitting device defining the hexagonal shape.

8. The display device of claim 1, wherein an area of the second surface is larger than an area of the first surface.

9. The display device of claim 1, wherein the light emitting device comprises a first semiconductor layer of p-type, an active layer, and a second semiconductor layer of n-type, which are sequentially stacked,
the first semiconductor layer is adjacent to the first surface, and
the second semiconductor layer is adjacent to the second surface.

10. The display device of claim 1, wherein the light emitting device comprises at least one of GaN, AlN, AlGaN, InGaN, InN, InAlGaN, AlInN, or combinations thereof.

11. A display device, comprising:
a plurality of pixels; and
a light emitting device provided in each of the plurality of pixels,
wherein the light emitting device comprises a first surface and a second surface, which are opposite to each other,
the light emitting device comprises a first semiconductor layer of p-type, an active layer, and a second semiconductor layer of n-type, which are sequentially stacked,
the first semiconductor layer is adjacent to the first surface,
the second semiconductor layer is adjacent to the second surface,
the first surface comprises a first region and a second region, which are edge and center regions thereof,
the first surface has a first width,
the second region has a second width,
a ratio of the second width to the first width ranges from 0.7 to 0.9, and
a density of threading dislocations is higher in the first region than in the second region.

12. The display device of claim 11, further comprising a metal oxide pattern covering the second surface of the light emitting device,
wherein the metal oxide pattern comprises a third region and a fourth region, which are edge and center regions thereof,
the fourth region has a contact hole exposing at least a portion of the second surface, and
the third region and the fourth region have crystalline phases different from each other.

13. The display device of claim 12, wherein the second region and the fourth region are vertically overlapped with each other.

14. The display device of claim 11, wherein a density of threading dislocations in the first surface ranges from $3 \times 10^6$/cm2 to $3 \times 10^8$/cm2.

15. The display device of claim 11, wherein the light emitting device further comprises a sidewall, which is extended from the first surface to the second surface, and
the sidewall comprises a {n −n 0 k} facet, where each of indices n and k is an integer of 1 or greater.

16. The display device of claim 11, further comprising a metal oxide pattern covering the second surface of the light emitting device,
wherein the metal oxide pattern comprises a third region and a fourth region, which are edge and center regions thereof, and
the fourth region has a contact hole exposing at least a portion of the second surface.

17. A light emitting device comprising:
a first semiconductor layer;
an active layer provided on the first semiconductor layer;
a second semiconductor layer provided on the active layer; and
a metal oxide pattern provided on the second semiconductor layer;
wherein the first semiconductor layer is adjacent to a first surface of the light emitting device, the second semiconductor layer is adjacent to a second surface of the light emitting device, and the first surface and the second surface face each other,
wherein the metal oxide pattern comprises a first region and a second region,
wherein the first region surrounds the second region, and
wherein the first region and the second region have different crystal phases.

18. The light emitting device of claim 17, wherein a density of the first region is higher than a density of the second region.

19. The light emitting device of claim 17, wherein the second region has a contact hole exposing at least a portion of the second surface.

20. The light emitting device of claim 17, wherein the first region comprises alumina of single crystalline α-phase, and
wherein the second region comprises alumina of polycrystalline γ-phase.

21. The light emitting device of claim 17, wherein the first surface comprises a third region and a fourth region, which are edge and center regions thereof, and
wherein a density of threading dislocations in the third region is higher than a density of threading dislocations in the fourth region.

22. The light emitting device of claim 17, wherein the light emitting device further comprises a sidewall, which is extended from the first surface to the second surface, and
wherein the sidewall comprises a {n −n 0 k} facet, where each of indices n and k is an integer of 1 or greater.

23. The light emitting device of claim 22, wherein the light emitting device has a hexagonal shape, when viewed in a plan view,
wherein the sidewall comprises first to sixth facets, and
wherein the first to sixth facets are arranged along sides of the light emitting device defining the hexagonal shape.

24. The light emitting device of claim 17, wherein an area of the second surface is larger than an area of the first surface.

25. The light emitting device of claim 17 wherein the first semiconductor layer is a P-type semiconductor layer, and the second semiconductor layer is an N-type semiconductor layer.

26. The light emitting device of claim 17, wherein the light emitting device includes at least one of GaN, AlN, AlGaN, InGaN, InN, InAlGaN, AlInN, and combination of thereof.

* * * * *